(12) United States Patent
Liang et al.

(10) Patent No.: US 11,024,399 B2
(45) Date of Patent: Jun. 1, 2021

(54) SHIFT REGISTER UNIT, GATE DRIVE CIRCUIT, DISPLAY DEVICE AND DRIVING METHOD

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xuebo Liang, Beijing (CN); Zhi Zhang, Beijing (CN); Xiuzhu Tang, Beijing (CN); Shuai Chen, Beijing (CN); Jingpeng Zhao, Beijing (CN); Xing Dong, Beijing (CN); Qian Qian, Beijing (CN); Taoliang Tang, Beijing (CN); Lijun Xiong, Beijing (CN); Zhenguo Tian, Beijing (CN); Shuang Hu, Beijing (CN); Hui Li, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/482,870

(22) PCT Filed: Nov. 15, 2018

(86) PCT No.: PCT/CN2018/115658
§ 371 (c)(1),
(2) Date: Aug. 1, 2019

(87) PCT Pub. No.: WO2019/134450
PCT Pub. Date: Jul. 11, 2019

(65) Prior Publication Data
US 2019/0355433 A1    Nov. 21, 2019

(30) Foreign Application Priority Data

Jan. 2, 2018    (CN) .......................... 201810001753.2

(51) Int. Cl.
*G09G 3/36*    (2006.01)
*G11C 19/28*    (2006.01)

(52) U.S. Cl.
CPC ........... *G11C 19/28* (2013.01); *G09G 3/3674* (2013.01); *G09G 2310/0283* (2013.01); *G09G 2310/0286* (2013.01)

(58) Field of Classification Search
None
See application file for complete search history.

(56) References Cited

U.S. PATENT DOCUMENTS 9,916,039 B2 *    3/2018    Gu ...................... G09G 3/2092
2008/0224912 A1    9/2008    Wang
(Continued)

FOREIGN PATENT DOCUMENTS

CN    104360781 A    2/2015
CN    106023945 A    10/2016
(Continued)

*Primary Examiner* — Parul H Gupta

(57) ABSTRACT

A shift register unit, a gate drive circuit, a display device and a driving method are disclosed. A shift register unit includes an input circuit, a first node reset circuit, an output circuit and a touch noise reduction circuit. The input circuit is configured to control a level of a first node in response to an input signal; the first node reset circuit is configured to reset the first node in response to a reset signal; the output circuit is configured to output a driving signal to an output terminal under control of the level of the first node; and the touch noise reduction circuit is configured to reset the first node in response to a touch start signal.

18 Claims, 15 Drawing Sheets

(56) References Cited

U.S. PATENT DOCUMENTS

2016/0132170 A1    5/2016  Zhang et al.
2017/0199617 A1*   7/2017  Gu .................... G06F 3/04184
2018/0210585 A1    7/2018  Guo et al.

FOREIGN PATENT DOCUMENTS

CN      106601170 A    4/2017
CN      107331418 A    11/2017

* cited by examiner

SHIFT REGISTER UNIT, GATE DRIVE CIRCUIT, DISPLAY DEVICE AND DRIVING METHOD

The present application claims the priority to Chinese patent application No. 201810001753.2, filed on Jan. 2, 2018, the entire disclosure of which is incorporated herein by reference as part of the present application.

TECHNICAL FIELD

Embodiments of the present disclosure relate to a shift register unit, a gate drive circuit, a display device and a driving method.

BACKGROUND

In fields of display technologies, for example, a pixel array of a liquid crystal display generally includes a plurality of rows of gate lines and a plurality of columns of data lines that intersect with the gate lines. The gate lines can be driven by an integrated driving circuit attached on an array substrate. In recent years, with the continuous improvement of an amorphous silicon thin film process, a gate drive circuit can also be directly fabricated on a thin film transistor array substrate to form a GOA (Gate driver On Array) to drive the gate lines. For example, the GOA including a plurality of cascaded shift register units can be used to provide on-off state voltage signals for the plurality of rows of gate lines of a pixel array, thereby controlling the plurality of rows of gate lines to be turned on sequentially. Data signals are provided by data lines to the pixel units in a corresponding row of the pixel array, thereby forming gray voltages required for displaying respective grayscales of an image, and displaying each frame of the image.

Touch screens can be divided into two types according to different structures, one type is an out-cell touch screen, and another type is an embedded touch screen. The embedded touch screen includes an on-cell touch screen and an in-cell touch screen. The in-cell touch screen has been widely used because the in-cell touch screen can reduce the overall thickness of the touch screen and the manufacturing cost of the touch screen.

SUMMARY

At least one embodiment of the present disclosure provides a shift register unit, which includes an input circuit, a first node reset circuit, an output circuit and a touch noise reduction circuit. The input circuit is configured to control a level of a first node in response to an input signal; the first node reset circuit is configured to reset the first node in response to a reset signal; the output circuit is configured to output a driving signal to an output terminal under control of the level of the first node; and the touch noise reduction circuit is configured to reset the first node in response to a touch start signal.

For example, in a shift register unit provided by an embodiment of the present disclosure, the input circuit, the first node reset circuit, the output circuit and the touch noise reduction circuit are connected with the first node.

For example, a shift register unit provided by an embodiment of the present disclosure further includes a first control circuit, a second control circuit, a first node noise reduction circuit and an output noise reduction circuit. The first control circuit is configured to control a level of a second node under control of the level of the first node and a level of a third node; the second control circuit is configured to control the level of the third node under control of the level of the first node; the first node noise reduction circuit is configured to perform noise reduction on the first node under control of the level of the second node; and the output noise reduction circuit is configured to perform noise reduction on the output terminal under control of the level of the second node.

For example, in a shift register unit provided by an embodiment of the present disclosure, the first control circuit is connected with the first node, the second node and the third node, the second control circuit is connected with the first node and the third node, the first node noise reduction circuit is connected with the first node and the second node, and the output noise reduction circuit is connected with the second node and the output terminal.

For example, in a shift register unit provided by an embodiment of the present disclosure, the touch noise reduction circuit includes a first transistor. A gate electrode of the first transistor is configured to be connected with a touch start terminal, a first electrode of the first transistor is configured to be connected with the first node, and a second electrode of the first transistor is connected with a first voltage terminal.

For example, in a shift register unit provided by an embodiment of the present disclosure, the touch noise reduction circuit further includes a second transistor. A gate electrode of the second transistor is configured to be connected with the touch start terminal, a first electrode of the second transistor is configured to be connected with the output terminal, and a second electrode of the second transistor is configured to be connected with the first voltage terminal.

For example, in a shift register unit provided by an embodiment of the present disclosure, the input circuit includes a third transistor, a gate electrode of the third transistor is connected with a first electrode of the third transistor, and a second electrode of the third transistor is connected with the first node. The first reset circuit includes a fourth transistor, a gate electrode of the fourth transistor is configured to be connected with a reset terminal, a first electrode of the fourth transistor is configured to be connected with the first node, and a second electrode of the fourth transistor is configured to be connected with a first voltage terminal. The output circuit includes a fifth transistor and a storage capacitor, a gate electrode of the fifth transistor is configured to be connected with the first node, a first electrode of the fifth transistor is configured to be connected with a clock signal terminal to receive a clock signal and the clock signal is used as the driving signal, and a second electrode of the fifth transistor is configured to be connected with the output terminal. A first electrode of the storage capacitor is connected with the first node, and a second electrode of the storage capacitor is connected with the output terminal.

For example, in a shift register unit provided by an embodiment of the present disclosure, the first control circuit includes a sixth transistor and a seventh transistor. A gate electrode of the sixth transistor is configured to be connected with the third node, a first electrode of the sixth transistor is configured to be connected with a second voltage terminal, and a second electrode of the sixth transistor is configured to be connected with the second node. A gate electrode of the seventh transistor is configured to be connected with the first node, a first electrode of the seventh transistor is configured to be connected with the second node, and a second electrode of the seventh transistor is configured to be connected with a first voltage terminal. The second control circuit includes an eighth transistor and a ninth transistor. A gate electrode of the eighth transistor is connected with a first electrode of the eighth transistor and the gate electrode of the eighth transistor is configured to be connected with a second voltage terminal, and a second electrode of the eighth transistor is configured to be connected with the third node. A gate electrode of the ninth transistor is configured to be connected with the first node, a first electrode of the ninth transistor is configured to be connected with the third node, and a second electrode of the ninth transistor is configured to be connected with the first voltage terminal. The first node noise reduction circuit includes a tenth transistor. A gate electrode of the tenth transistor is configured to be connected with the second node, a first electrode of the tenth transistor is configured to be connected with the first node, and a second electrode of the tenth transistor is configured to be connected with the first voltage terminal. The output noise reduction circuit includes an eleventh transistor. A gate electrode of the eleventh transistor is configured to be connected with the second node, a first electrode of the eleventh transistor is configured to be connected with the output terminal, and a second electrode of the eleventh transistor is configured to be connected with the first voltage terminal.

At least one embodiment of the present disclosure further provides a driving method of the shift register unit, and the driving method includes: controlling the level of the first node, by the input circuit, in response to the input signal; outputting the driving signal to the output terminal, by the output circuit, under control of the level of the first node; resetting the first node, by the first node reset circuit, in response to the reset signal; and resetting the first node, by the touch noise reduction circuit, in response to the touch start signal.

At least one embodiment of the present disclosure further provides a gate drive circuit, and the gate drive circuit includes a plurality of cascaded shift register units. The plurality of shift register units include P first shift register units, each of the P first shift register units adopts the shift register unit according to any one of the embodiments of the present disclosure, and P is an integer greater than zero.

For example, a gate drive circuit provided by an embodiment of the present disclosure further includes a touch start signal line and P touch stop signal lines. A reset terminal of each of the P first shift register units and a touch start terminal of each of the P first shift register units are connected with the touch start signal line to receive the touch start signal; and input terminals of next stages of shift register units of respective first shift register units are respectively connected with the P touch stop signal lines to receive different touch stop signals.

For example, in a gate drive circuit provided by an embodiment of the present disclosure, the P touch stop signal lines include a first touch stop signal line. An (N)th stage of shift register unit is one of the P first shift register units, a reset terminal of the (N)th stage of shift register unit and a touch start terminal of the (N)th stage of shift register unit are connected with the touch start signal line to receive the touch start signal, an input terminal of an (N+1)th stage of shift register unit is connected with the first touch stop signal line to receive a first touch stop signal, and N is an integer greater than one.

For example, in a gate drive circuit provided by an embodiment of the present disclosure, the P touch stop signal lines further include a second touch stop signal line. An (M)th stage of shift register unit is one of the P first shift register units, an reset terminal of the (M)th stage of shift register unit and a touch start terminal of the (M)th stage of shift register unit are connected with the touch start signal line to receive the touch start signal, and an input terminal of an (M+1)th stage of shift register unit is connected with the second touch stop signal line to receive a second touch stop signal; except a last stage of shift register unit, the (N)th stage of shift register unit and the (M)th stage of shift register unit, a reset terminal of each of other stages of shift register units is connected with an output terminal of a shift register unit in a next stage; except a first stage of shift register unit, the (N+1)th stage of shift register unit and the (M+1)th stage of shift register unit, an input terminal of each of other stages of shift register units is connected with an output terminal of a shift register unit in a previous stage; M is an integer greater than four, and M>N+2.

For example, a gate drive circuit provided by an embodiment of the present disclosure further includes a first clock signal line and a second clock signal line. The first clock signal line is connected with a clock signal terminal of a (2n−1)th stage of shift register unit, the second clock signal line is connected with a clock signal terminal of a (2n)th stage of shift register unit, and n is an integer greater than zero.

For example, a gate drive circuit provided by an embodiment of the present disclosure further includes a first touch start signal line, a second touch start signal line, Q touch stop signal lines, Q first shift register unit groups and Q second shift register unit groups. P=2Q, and Q is an integer greater than zero; each of the Q first shift register unit groups includes two adjacent cascaded first shift register units, and each of the Q second shift register unit groups includes two shift register units which are cascaded with each of the Q first shift register unit groups, after the each of the Q first shift register unit groups; a reset terminal of an earlier stage of shift register unit in each of the Q first shift register unit groups and a touch start terminal of the earlier stage of shift register unit in each of the Q first shift register unit groups are connected with the first touch start signal line to receive a first touch start signal, and a reset terminal of a later stage of shift register unit in each of the Q first shift register unit groups and a touch start terminal of the later stage of shift register unit in each of the Q first shift register unit groups are connected with the second touch start signal line to receive a second touch start signal; and input terminals of the two shift register units of each of the Q second shift register unit groups are connected with a same one of the Q touch stop signal lines, and input terminals of shift register units of different second shift register unit groups are connected with different touch stop signal lines.

For example, in a gate drive circuit provided by an embodiment of the present disclosure, the Q touch stop signal lines include a first touch stop signal line. An (N−1)th stage of shift register unit and an (N)th stage of shift register unit are two of the P first shift register units, a reset terminal of the (N−1)th stage of shift register unit and a touch start terminal of the (N−1)th stage of shift register unit are connected with the first touch start signal line to receive a first touch start signal, a reset terminal of the (N)th stage of shift register unit and a touch start terminal of the (N)th stage of shift register unit are connected with the second touch start signal line to receive a second touch start signal, an input terminal of an (N+1)th stage of shift register unit and an input terminal of an (N+2)th stage of shift register unit are connected with the first touch stop signal line to receive a first touch stop signal, and N is an integer greater than two.

For example, in a gate drive circuit provided by an embodiment of the present disclosure, the Q touch stop signal lines further include a second touch stop signal line. An (M−1)th stage of shift register unit and an (M)th stage of shift register unit are two of the P first shift register units; a reset terminal of the (M−1)th stage of shift register unit and a touch start terminal of the (M−1)th stage of shift register unit are connected with the first touch start signal line to receive the first touch start signal; a reset terminal of the (M)th stage of shift register unit and a touch start terminal of the (M)th stage of shift register unit are connected with the second touch start signal line to receive the second touch start signal; an input terminal of an (M+1)th stage of shift register unit and an input terminal of an (M+2)th stage of shift register unit are connected with the second touch stop signal line to receive a second touch stop signal; except last two stages of the shift register units, the (N−1)th stage of shift register unit, the (M−1)th stage of shift register unit, the (N)th stage of shift register unit and the (M)th stage of shift register unit, a reset terminal of each of other stages of shift register units is connected with an output terminal of a shift register unit of a next two stage after the each of other stages of shift register units; except a first stage of shift register unit, a second stage of shift register unit, the (N+1)th stage of shift register unit, the (M+1)th stage of shift register unit, the (N+2)th stage of shift register unit and the (M+2)th stage of shift register unit, an input terminal of each of other stages of shift register units is connected with an output terminal of a shift register unit of a previous two stage before the each of other stages of shift register units; and M is an integer greater than six, and M>N+3.

For example, a gate drive circuit provided by an embodiment of the present disclosure further includes a first clock signal line, a second clock signal line, a third clock signal line and a fourth clock signal line. The first clock signal line is connected with a clock signal terminal of a (4n−3)th stage of shift register unit, the second clock signal line is connected with a clock signal terminal of a (4n−2)th stage of shift register unit, the third clock signal line is connected with a clock signal terminal of a (4n−1)th stage of shift register unit, the fourth clock signal line is connected with a clock signal terminal of a (4n)th stage of the shift register unit, and n is an integer greater than zero.

At least one embodiment of the present disclosure further provides a display device, and the display device includes the gate drive circuit according to any one of the embodiments of the present disclosure.

At least one embodiment of the present disclosure further provides a driving method of the gate drive circuit, and the driving method includes: inputting a touch start signal to touch noise reduction circuits of the P first shift register units to reset first nodes of the P first shift register units.

For example, a driving method provided by an embodiment of the present disclosure includes at least a touch scanning phase, an (X)th stage of shift register unit is one of the P first shift register units, X is an integer greater than one, and the driving method further comprising: in a first stage, an output terminal of the (X)th stage of shift register unit outputting a gate scanning signal; in a second stage, inputting the touch start signal through a touch start signal line to reset a first node of the (X)th stage of shift register unit; causing the gate drive circuit to enter the touch scanning phase; in a third stage, inputting a touch stop signal through a touch stop signal line to control a level of a first node of an (X+1)th stage of shift register unit; and in a fourth stage, an output terminal of the (X+1)th stage of shift register unit outputting the gate scanning signal.

For example, a driving method provided by an embodiment of the present disclosure includes at least a touch scanning phase, a (Y−1)th stage of shift register unit and a (Y)th stage of shift register unit are two of the P first shift register units, Y is an integer greater than two, and the driving method further comprising: in a first stage, an output terminal of the (Y−1)th stage of shift register unit outputting a gate scanning signal; in a second stage, an output terminal of the (Y)th stage of shift register unit outputting the gate scanning signal; in a third stage, inputting a first touch start signal through a first touch start signal line to reset a first node of the (Y−1)th stage of shift register unit; in a fourth stage, inputting a second touch start signal through a second touch start signal line to reset a first node of the (Y)th stage of shift register unit; causing the gate drive circuit to enter the touch scanning phase; in a fifth stage, inputting a touch stop signal through a touch stop signal line to control a level of a first node of a (Y+1)th stage of shift register unit and a level of a first node of a (Y+2)th stage of shift register unit; in a sixth stage, an output terminal of the (Y+1)th stage of shift register unit outputting the gate scanning signal; and in a seventh stage, an output terminal of the (Y+2)th stage of shift register unit outputting the gate scanning signal.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
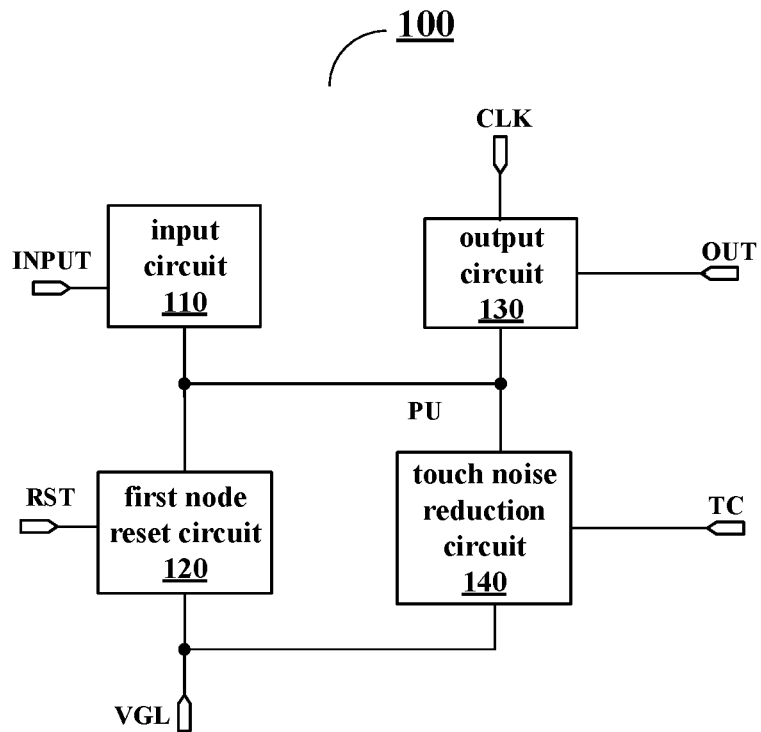
FIG. 1 is a schematic diagram of a shift register unit provided by an example of an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In display panel technologies, in order to realize low cost and narrow bezel, GOA (Gate driver On Array) technologies can be adopted, i.e. a gate drive circuit is integrated on the display panel by thin film transistor manufacturing processes, thereby realizing advantages such as narrow bezel, reducing assembly cost and the like. For example, the GOA technologies can also be applied to a touch screen.

For example, in a display phase of a touch screen, a touch scanning phase can be inserted in a blanking region (interval region) between two adjacent frames of display images to implement one touch scanning. In this case, a touch report rate of the touch screen is identical to a display frame rate, for example, 60 Hz. As the size of the touch screen increases, the requirement for the touch rate is also higher. For example, when a user uses a stylus to sign on the touch screen, a higher touch report rate is required, for example, higher than 100 Hz, to meet the need of smooth signature.

For example, a method for increasing the touch report rate is to insert a plurality of touch scanning phases in a segment in the display phase of one frame of image. Although the touch scanning method effectively improves the touch report rate of the touch screen, the display quality of the touch screen can also be affected. In one aspect, due to the insertion of the touch scanning phase, levels of first nodes of two GOA units adjacent to the touch scanning phase are always in a high-level state in the touch scanning phase, which may cause output terminals of the two GOA units fluctuate greatly in the touch scanning phase, and cause an abnormal display. In another aspect, because there may be a leakage current in a thin film transistor (TFT) in the touch scanning phase, a level of a first node of a first row of GOA units after the end of the touch scanning phase is continuously decreased, which may cause the output voltages of the first row of GOA units after the end of the touch scanning phase to be insufficient, and cause a display defect such as a dark line.

At least one embodiment of the present disclosure provides a shift register unit including an input circuit, a first node reset circuit, an output circuit and a touch noise reduction circuit. The input circuit is configured to control a level of a first node in response to an input signal; the first node reset circuit is configured to reset the first node in response to a reset signal; the output circuit is configured to output a driving signal to an output terminal under control of the level of the first node; and the touch noise reduction circuit is configured to reset the first node in response to a touch start signal. Embodiments of the present disclosure further provide a gate drive circuit, a display device and a driving method corresponding to the above-described shift register unit.

The shift register unit, the gate drive circuit, the display device and the driving method provided by the embodiments of the present disclosure can control the level of the first node by the touch noise reduction circuit. In one aspect, the level of the first node can be kept in a low-level state in the touch scanning phase, so that the output terminal of the shift register unit can be prevented from outputting abnormally affected by a clock signal, and interferences, which are caused by the outputting abnormally of the output terminal of the shift register unit to a touch scanning signal, can be avoided. In another aspect, the level of the first node can be charged to a high-level state after the end of the touch scanning phase, so that the phenomenon of the output abnormality caused by too low potential of the first node of the first GOA unit after the end of the touch scanning phase can be avoided, and thereby improving the display quality.

The embodiments of the present disclosure and examples thereof will be described in detail below with reference to the accompanying drawings.

An example of an embodiment of the present disclosure provides a shift register unit 100, as shown in FIG. 1, the shift register unit 100 includes an input circuit 110, a first node reset circuit 120, an output circuit 130 and a touch noise reduction circuit 140.

The input circuit 110 is configured to control a level of a first node PU in response to an input signal, for example, to charge the first node PU. For example, the input circuit 110 is connected with an input terminal INPUT and the first node PU, and the input circuit 110 is configured to cause the first node PU to be electrically connected with the input terminal INPUT under control of the input signal inputted by the input terminal INPUT, thereby causing the input signal, for example a high-level signal, inputted by the input terminal INPUT to charge the first node PU.

It should be noted that in the embodiments of the present disclosure, the operation of controlling a level of a node (e.g., the first node PU, the second node PD, the third node PD_CN, etc.) includes charging the node to pull up the level of the node, or discharging the node to pull down the level of the node. Charging a node means to, for example, electrically connect the node with a high-level voltage signal, thereby pulling up the level of the node by using the high-level voltage signal; discharging the node means to, for example, electrically connect the node to a low-level voltage signal, thereby pulling down the level of the node by using the low-level voltage signal. For example, a capacitor can be set to be electrically connected to the node, and controlling the level of the node means to control a level stored by the capacitor electrically connected to the node.

The first node reset circuit 120 is configured to reset the first node PU in response to a reset signal. For example, the first node reset circuit 120 is configured to be connected with a reset terminal RST, so that the first node PU can be connected with a low-level signal or a low voltage terminal under control of the reset signal inputted by the reset terminal RST. For example, the low voltage terminal is a first voltage terminal VGL, thereby resetting the first node PU. It should be noted that the first voltage terminal VGL can be configured to continue inputting a direct-current (DC) low-level signal, for example, and the following embodiments are identical to the above embodiments and details are not described herein again.

The output circuit 130 is configured to output a driving signal to an output terminal OUT under control of the level of the first node PU. For example, the output circuit 130 is configured to cause a clock signal terminal CLK to be electrically connected with the output terminal OUT under control of the level of the first node PU, so that a clock signal inputted by the clock signal terminal CLK can be outputted to the output terminal OUT and served as the driving signal.

The touch noise reduction circuit 140 is configured to reset the first node PU in response to a touch start signal. For example, the touch noise reduction circuit 140 is configured to be connected with a touch start terminal TC, thereby causing the first node PU to be electrically connected with the first voltage terminal VGL under control of the touch start signal inputted by the touch start terminal TC, and thereby resetting the first node PU.

Figure 2A:
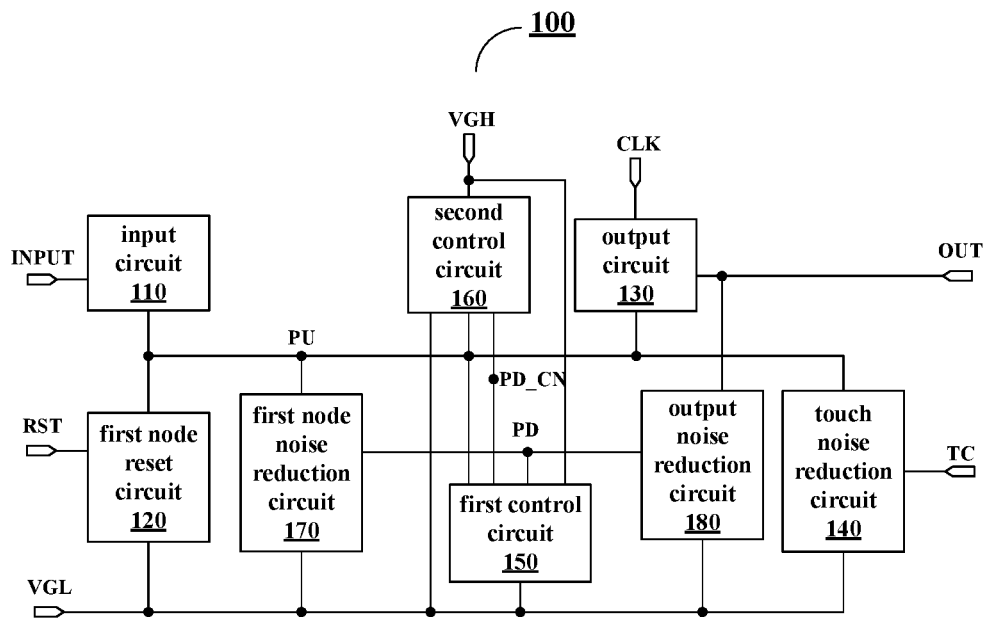
FIG. 2A is a schematic diagram of a shift register unit provided by another example of an embodiment of the present disclosure.
Figure 2B:
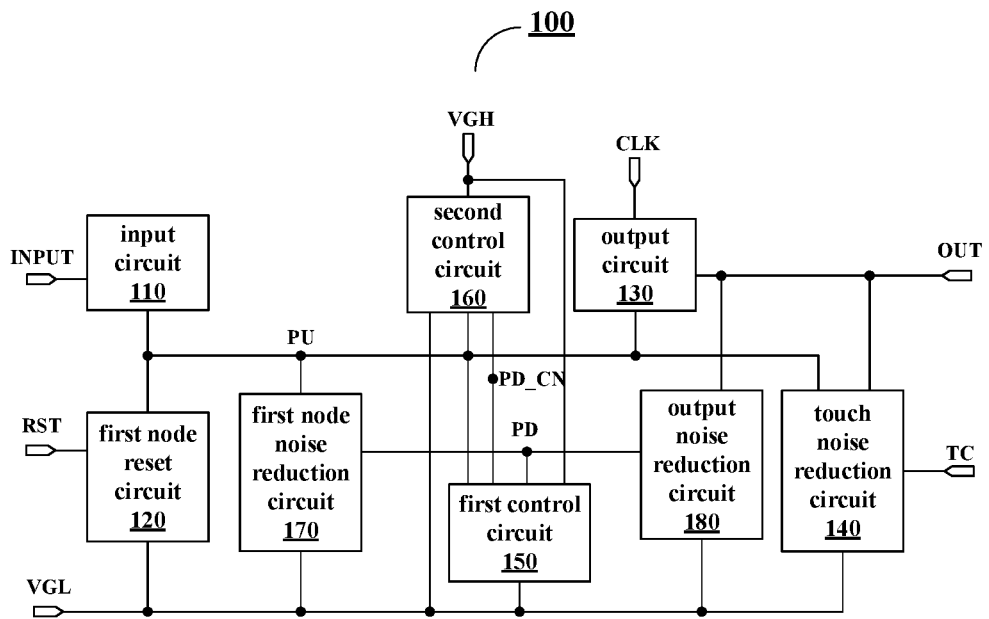
FIG. 2B is a schematic diagram of a shift register unit provided by yet another example of an embodiment of the present disclosure.

For example, in some examples, as shown in FIG. 2B, the touch noise reduction circuit 140 can further be connected with the output terminal OUT, so that the output terminal OUT can be reset and denoised under control of the touch start signal inputted by the touch start terminal TC.

For example, a plurality of cascaded shift register units 100 may be adopted to form a gate drive circuit. In a case where a display device is driven by the gate drive circuit, the level of the first node PU can be controlled by the touch noise reduction circuit 140 to be maintained a low-level state in the touch scanning phase, so the output terminal OUT of the shift register unit can be prevented from outputting abnormally affected by a clock signal, and meanwhile, the interferences, which are caused by the outputting abnormally of the output terminal of the shift register unit to a touch scanning signal, can be avoided, and thereby improving the display quality of the display device.

For example, as shown in FIG. 2A and FIG. 2B, in another example of an embodiment of the present disclosure, the shift register unit 100 further includes a first control circuit 150, a second control circuit 160, a first node noise reduction circuit 170 and an output noise reduction circuit 180.

The first control circuit 150 is configured to control a level of a second node PD under control of the level of the first node PU and a level of a third node PD_CN, and further to control the first node noise reduction circuit 170 and the output noise reduction circuit 180.

For example, the first control circuit 150 is connected to the first voltage terminal VGL, a second voltage terminal VGH, the first node PU, the second node PD and the third node PD_CN, and the first control circuit 150 electrically connects the second node PD and the first voltage terminal VGL under control of the level of the first node PU, thereby controlling a level of the second node PD (for example, pulling down the level of the second node PD). In addition, the first control circuit 150 electrically connects the second node PD and the second voltage terminal VGH under control of a level of the third node PD_CN, thereby controlling the level of the second node PD (for example, pulling up the level of the second node PD). For example, the second voltage terminal VGH can be configured to continue inputting of DC high-level signal, and the following embodiments of the present disclosure are identical to the above embodiments and details are not described herein again.

The second control circuit 160 is configured to control the level of the third node PD_CN under control of the level of the first node PU. For example, the second control circuit 160 is connected to the first voltage terminal VGL, the second voltage terminal VGH, the first node PU and the third node PD_CN, and the second control circuit 160 electrically connects the third node PD_CN and the first voltage terminal VGL under control of the level of the first node PU, thereby controlling the level of the third node PD_CN.

The first node noise reduction circuit 170 is configured to perform noise reduction on the first node PU under control of the level of the second node PD. For example, the first node noise reduction circuit 170 is configured to be connected with the first voltage terminal VGL, and to electrically connect the first node PU and the first voltage terminal VGL under control of the level of second node PD, thereby performing noise reduction on the first node PU.

The output noise reduction circuit 180 is configured to perform noise reduction on the output terminal OUT under control of the level of the second node PD. For example, the output noise reduction circuit 180 is configured to electrically connect the output terminal OUT and the first voltage terminal VGL under control of the level of the second node PD, thereby performing noise reduction on the output terminal OUT.

Figure 3A:
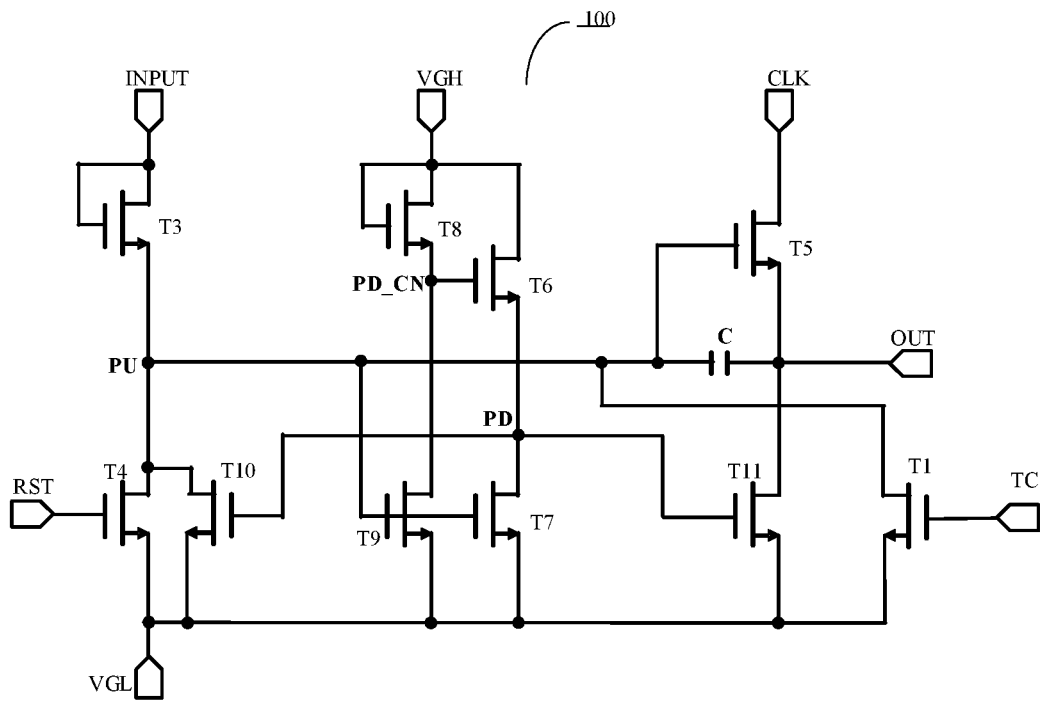
FIG. 3A is a circuit schematic diagram of an implementation example of the shift register unit as shown in FIG. 2A.

For example, the shift register unit 100 as shown in FIG. 2A can be implemented as a circuit structure as shown in FIG. 3A in an example.

As shown in FIG. 3A, in the example, in more detail, the touch noise reduction circuit 140 can be implemented as a first transistor T1. A gate electrode of the first transistor T1 is configured to be connected with a touch start terminal TC to receive the touch start signal, a first electrode of the first transistor T1 is configured to be connected with the first node PU to reset the first node PU, and a second electrode of the first transistor T1 is configured to be connected with the first voltage terminal VGL to receive a first voltage.

Figure 3B:
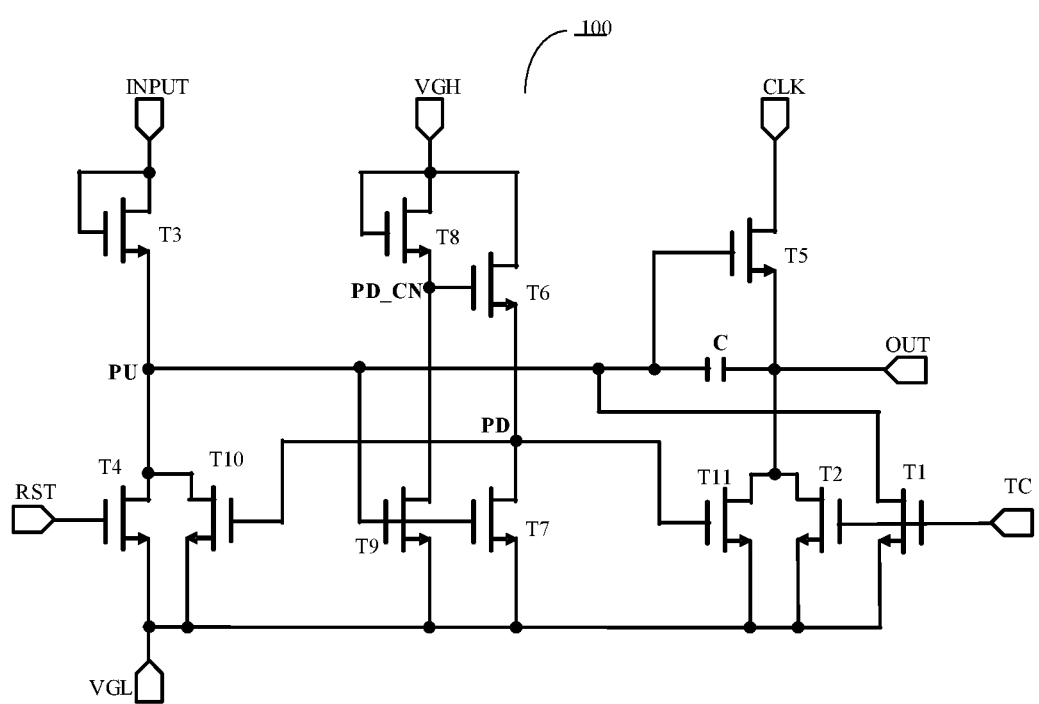
FIG. 3B is a circuit schematic diagram of an implementation example of the shift register unit as shown in FIG. 2B.

For example, as shown in FIG. 3B, the touch noise reduction circuit 140 further includes a second transistor T2. A gate electrode of the second transistor T2 is configured to be connected with the touch start terminal TC to receive the touch start signal, a first electrode of the second transistor T2 is configured to be connected with the output terminal OUT to perform reset and noise reduction on the output terminal OUT, a second electrode of the second transistor T2 is configured to be connected with the first voltage terminal VGL to receive the first voltage.

It should be noted that in the embodiments of the present disclosure, for example, the first voltage terminal VGL is configured to continue inputting a DC low-level signal, and the DC low-level is referred to as the first voltage; and for example, the second voltage terminal VGH is configured to continue inputting a DC high-level signal, and the DC high-level is referred to as the second voltage. The following embodiments are the same as those described herein and will not be described again.

In addition, it should be noted that in the embodiments of the present disclosure, the high level and the low level are described relatively. The high level represents a relatively higher voltage range (for example, the high level can adopt 5V, 10V, or other appropriate voltage), and multiple high levels can be same or different. Similarly, the low level indicates a lower voltage range (for example, the low level can adopt 0V, −5V, −10V, or other appropriate voltage), and multiple low levels can be same or different. For example, a minimum value of the high level is greater than a maximum value of the low level.

The input circuit 110 can be implemented as a third transistor T3. A gate electrode of the third transistor T3 is connected with a first electrode of the third transistor T3, and the gate electrode of the third transistor T3 is configured to be connected with the input terminal INPUT to receive the input signal. A second electrode of the third transistor T3 is configured to be connected with the first node PU to control the level of the first node PU.

The first node reset circuit 120 can be implemented as a fourth transistor T4. A gate electrode of the fourth transistor T4 is configured to be connected with the reset terminal RST to receive the reset signal, a first electrode of the fourth transistor T4 is configured to be connected with the first node PU to reset the first node PU, and a second electrode of the fourth transistor T4 is configured to be connected with the first voltage terminal VGL to receive the first voltage.

The output circuit 130 can be implemented to include a fifth transistor T5 and a storage capacitor C. A gate electrode of the fifth transistor T5 is configured to be connected with the first node PU, a first electrode of the fifth transistor T5 is configured to be connected with a clock signal terminal CLK to receive a clock signal, and the clock signal is served as the driving signal, and a second electrode of the fifth transistor T5 is configured to be connected with the output terminal OUT. A first electrode of the storage capacitor C is configured to be connected with the gate electrode of the fifth transistor T5, i.e., the first node PU, and a second electrode of the storage capacitor C is connected with the second electrode of the fifth transistor T5, i.e., the output terminal OUT.

The first control circuit 150 can be implemented to include a sixth transistor T6 and a seventh transistor T7. A gate electrode of the sixth transistor T6 is configured to be connected with the third node PD_CN, a first electrode of the sixth transistor T6 is configured to be connected with the second voltage terminal VGH to receive the second voltage, and a second electrode of the sixth transistor T6 is configured to be connected with the second node PD. A gate electrode of the seventh transistor T7 is configured to be connected with the first node PU, a first electrode of the seventh transistor T1 is configured to be connected with the second node PD, and a second electrode of the seventh transistor T7 is configured to be connected with the first voltage terminal VGL to receive the first voltage.

The second control circuit 160 can be implemented to include an eighth transistor T8 and a ninth transistor T9. A gate electrode of the eighth transistor T8 is connected with a first electrode of the eighth transistor T8 and the gate electrode of the eighth transistor T8 is configured to be connected with the second voltage terminal VGH to receive the second voltage, and a second electrode of the eighth transistor T8 is configured to be connected with the third node PD_CN. A gate electrode of the ninth transistor T9 is configured to be connected with the first node PU, a first electrode of the ninth transistor T9 is configured to be connected with the third node PD_CN, and a second electrode of the ninth transistor T9 is configured to be connected with the first voltage terminal VGL to receive the first voltage.

The first node noise reduction circuit 170 can be implemented as a tenth transistor T10. A gate electrode of the tenth transistor T10 is configured to be connected with the second node PD, a first electrode of the tenth transistor T10 is configured to be connected with the first node PU to perform noise reduction on the first node PU, and a second electrode of the tenth transistor T10 is configured to be connected with the first voltage terminal VGL to receive the first voltage.

The output noise reduction circuit 180 can be implemented as an eleventh transistor T11. A gate electrode of the eleventh transistor T11 is configured to be connected with the second node PD, a first electrode of the eleventh transistor T11 is configured to be connected with the output terminal OUT, and a second electrode of the eleventh transistor T11 is configured to be connected with the first voltage terminal VGL to receive the first voltage.

For example, the shift register unit 100 as shown in FIG. 2B can be implemented as a circuit structure as shown in FIG. 3B in an example. As shown in FIG. 3B, the shift register unit 100 differs from the shift register unit as shown in FIG. 3A in that the shift register unit 100 further includes a second transistor T2.

As shown in FIG. 3B, in the example, in more detail, the touch noise reduction circuit 140 further includes a second transistor T2. A gate electrode of the second transistor T2 is configured to be connected with the touch start terminal TC to receive the touch start signal, a second electrode of the second transistor T2 is configured to be connected with the output terminal OUT to perform reset and noise reduction on the output terminal OUT, and a second electrode of the second transistor T2 is configured to be connected with the first voltage terminal VGL to receive the first voltage.

The connection relationships of other transistors and the storage capacitor C as shown in FIG. 3B can be referred to the corresponding descriptions of the shift register unit 100 as shown in FIG. 3A, and details are not described herein again.

It should be noted that the transistors used in the embodiments of the present disclosure can adopt thin film transistors, field-effect transistors or other switching devices with the same characteristics, and the embodiments of the present disclosure are all described by taking the thin film transistors as examples. Source electrodes and drain electrodes of the transistors adopted herein can be symmetrical in structure, so the source electrodes and drain electrodes are not different in structure. In the embodiments of the present disclosure, in order to distinguish between the two electrodes of a transistor other than a gate electrode, one of the two electrodes is directly described to a first electrode and the other electrode is directly described to a second electrode.

In addition, the embodiments of the present disclosure are all described by taking a case where that the transistors are N-type transistors as an example. In this case, the first electrode may be a drain electrode and the second electrode may be a source electrode. It should be noted that the present disclosure includes but is not limited to this case. For example, one or more transistors in the shift register unit provided by the embodiments of the present disclosure may also adopt P-type transistors. In this case, the first electrode may be a source electrode and the second electrode may be a drain electrode, and as long as polarities of the respective electrodes of selected-type transistors correspondingly be connected in accordance with the polarities of the respective electrodes of the respective transistors in the embodiment of the present disclosure.

For example, as shown in FIG. 3A and FIG. 3B, each of the transistors in the shift register unit 100 adopts an N-type transistor, the first voltage terminal VGL continues inputting the first voltage of a DC low-level, the second voltage terminal VGH continues inputting the second voltage of a DC high-level, the clock signal terminal CLK inputs the clock signal, and the touch start terminal TC inputs the touch start signal.

Figure 4:
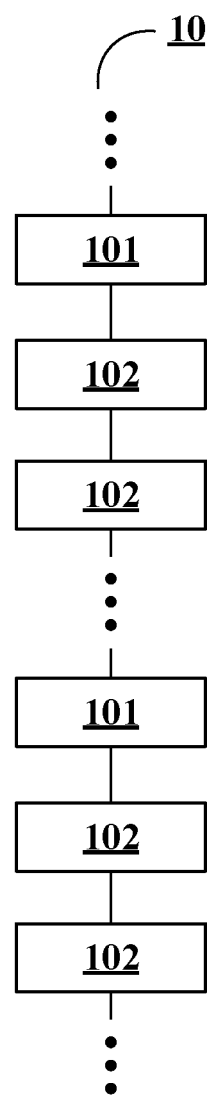
FIG. 4 is a schematic diagram of a gate drive circuit provided by an embodiment of the present disclosure.

At least one embodiment of the present disclosure provides a gate drive circuit 10, as shown in FIG. 4, the gate drive circuit 10 includes a plurality of cascaded shift register units. For example, the plurality of shift register units include P first shift register units 101 and a plurality of shift register units 102. For example, the first shift register unit 101 adopts the shift register unit 100 provided by the embodiment of the present disclosure, for example, the shift register unit 100 as shown in FIG. 3A or FIG. 3B. P is an integer greater than 0, and the embodiment of the present disclosure does not limit a number of the first shift register units 101 included in the gate drive circuit 10.

It should be noted that the shift register unit 102 as shown in FIG. 4 is illustrated for distinguishing from the first shift register unit 101. The shift register unit 102 can be identical to the first shift register unit 101, that is, the shift register unit 102 can adopt the shift register unit 100 provided by the embodiment of the present disclosure, and the shift register unit 102 can adopt other shift register unit, which is existed or under development, as long as the shift register unit can be applied to the gate drive circuit to output gate scanning signals, the embodiments of the present disclosure do not limit to this case. The shift register unit 102 in the following embodiment and its drawings is the same as this case, and will not be described again. In addition, only two first shift register units 101 and four shift register units 102 are schematically illustrated in FIG. 4, and the embodiments of the present disclosure include but are not limited thereto.

Figure 5A:
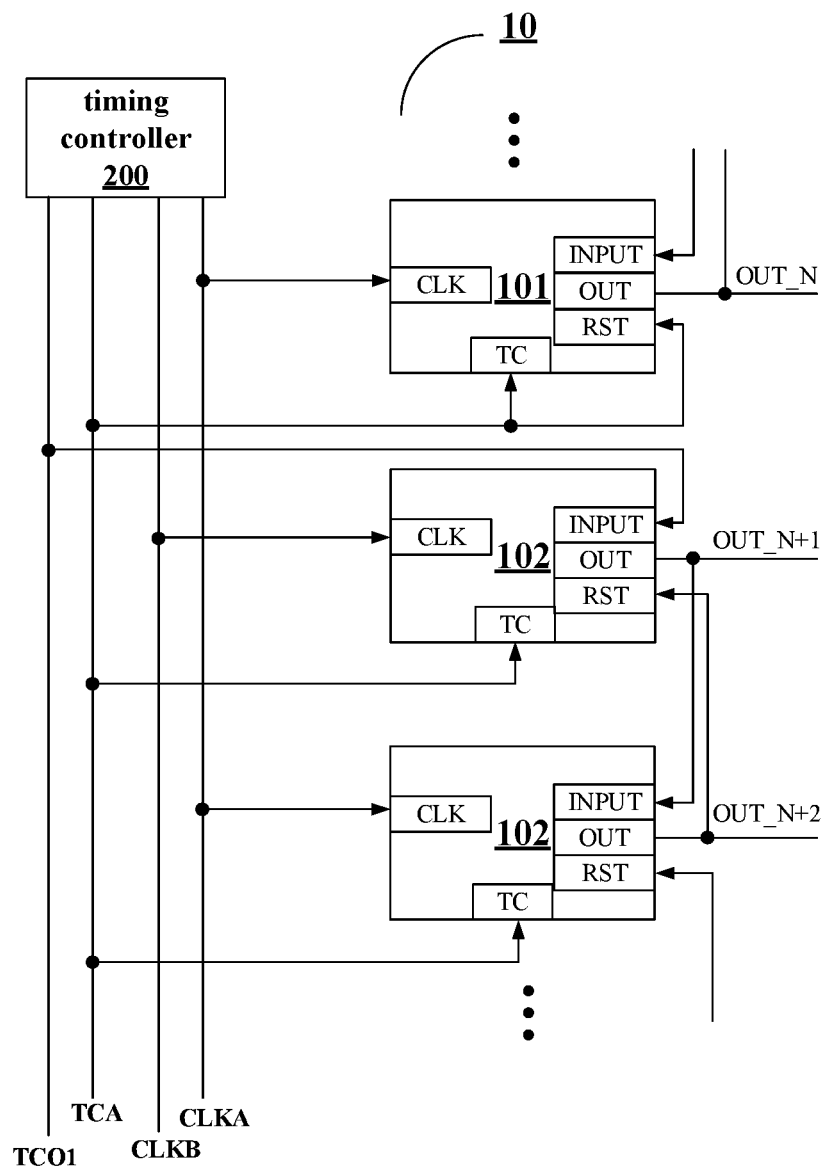
FIG. 5A is a schematic diagram of a gate drive circuit provided by an example of an embodiment of the present disclosure.

For example, in an example of the embodiment of the present disclosure, the gate drive circuit 10 as shown in FIG. 4 further includes a touch start signal line and P touch stop signal lines, which are not shown in FIG. 4. It should be noted that a number of the touch stop signal lines is consistent with a number of the first shift register units 101. For example, in an example, as shown in FIG. 5A, the gate drive circuit 10 includes one first shift register unit 101, and one touch stop signal line such as a first touch stop signal line TCO1 is correspondingly needed to be set, and in this case, a touch scanning phase can be inserted in a display phase of a frame of image. For example, in another example, as shown in FIG. 6A, the gate drive circuit 10 includes two first shift register units 101, and two touch stop signal lines, such as a first touch stop signal line TCO1 and a second touch stop signal line TCO2, is correspondingly needed to be set, and in this case, two touch scanning phases can be inserted in a display phase of a frame of image.

For example, in the gate drive circuit 10 provided in the above example, in a case where the gate drive circuit includes the touch start signal line and the P touch stop signal lines, a reset terminal and a touch start terminal of each of the P first shift register units 101 of the gate drive circuit 10 are connected with the touch start signal line to receive the touch start signal; and input terminals of next stages of shift register units of respective first shift register units are respectively connected with the P touch stop signal lines to receive different touch stop signals.

Figure 6A:
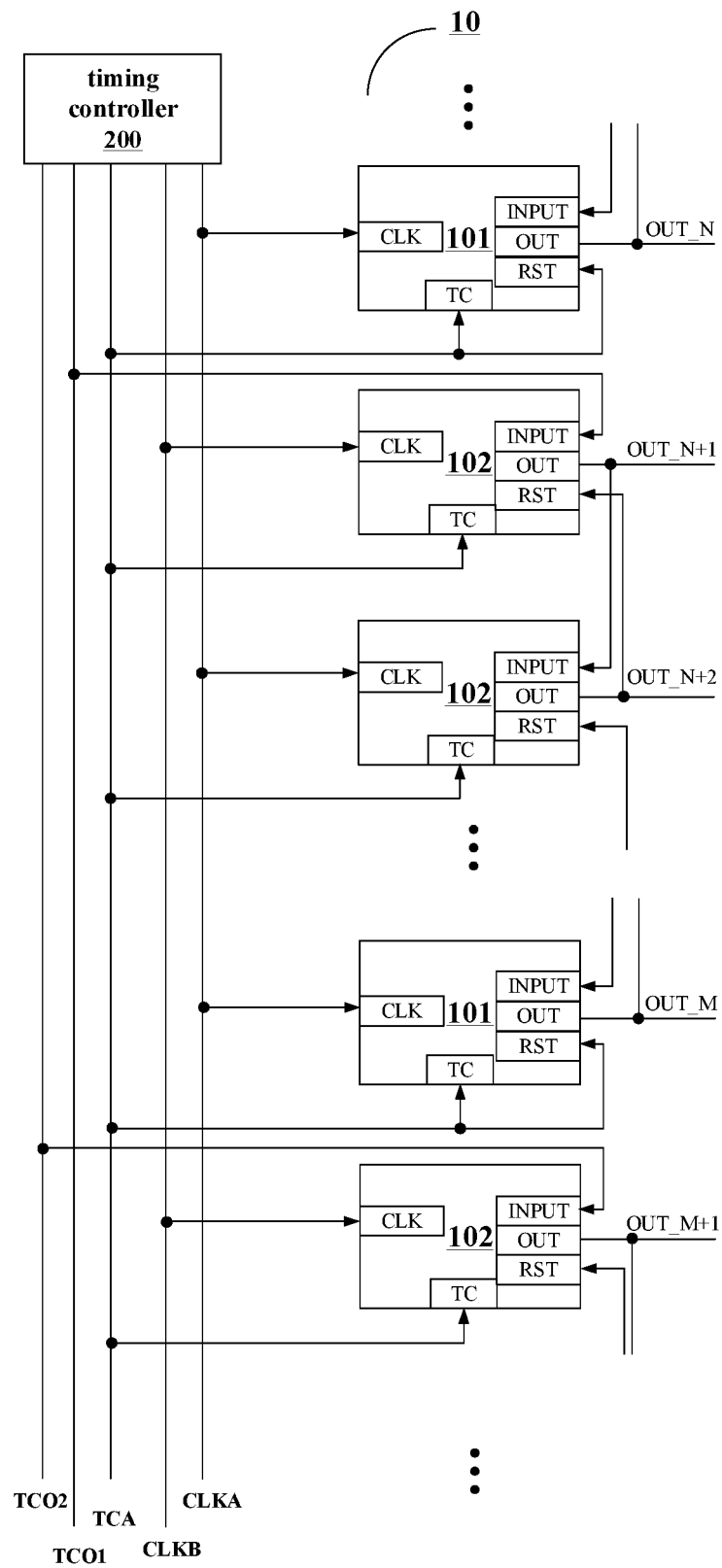
FIG. 6A is a schematic diagram of a gate drive circuit provided by another example of an embodiment of the present disclosure.

The connection relationships between the touch start signal line and each stage of shift register unit of the gate drive circuit 10, the connection relationships between the touch stop signal line and each stage of shift register unit of the gate drive circuit 10, and the operation principle of the gate drive circuit 10 will be described below with reference to the examples as shown in FIG. 5A and FIG. 6A.

For example, as shown in FIG. 5A, an example of an embodiment of the present disclosure provides a gate drive circuit 10 including a plurality of cascaded shift register units, a touch start signal line TCA, and a first touch stop signal line TCO1. For example, the plurality of cascaded shift register units include one first shift register unit 101 and a plurality of shift register units 102.

It should be noted that OUT_N as shown in FIG. 5A represents an output terminal of an (N)th stage of shift register unit, OUT_N+1 represents an output terminal of an (N+1)th stage of shift register unit, and OUT_N+2 represents an output terminal of an (N+2)th stage of shift register unit. The reference numerals in the following embodiments are similar to this and will not be described again.

For example, as shown in FIG. 5A, the (N)th stage (N is an integer greater than 1) of shift register unit is the first shift register unit 101. A reset terminal RST and a touch start terminal TC of the (N)th stage of shift register unit are connected with the touch start signal line TCA to receive the touch start signal. An input terminal INPUT of the (N+1)th stage of shift register unit 102 is connected with the first touch stop signal line TCO1 to receive the first touch stop signal.

It should be noted that the shift register unit 102 as shown in FIG. 5A includes a touch start terminal TC, and in this case, the touch start terminal TC of the shift register unit 102 is connected with the touch start signal line TCA. The embodiments of the present disclosure include, but are not limited to this case, in some examples, for example, as shown in FIG. 5C, the shift register unit 102 does not include the touch start terminal TC, in which case the shift register unit 102 does not need to be connected with the touch start signal line TCA. The shift register unit 102 in the following embodiments and the drawings thereof are the same as the case, and will not be described again.

For example, as shown in FIG. 5A, except a last stage of shift register unit and the (N)th stage of shift register unit 101, a reset terminal RST of each of other stages of shift register units is connected with an output terminal OUT of a shift register unit in a next stage after each of other stages of shift register units. Except a first stage of shift register unit and the (N+1)th stage of shift register unit 102, an input terminal INPUT of each of other stages of shift register units is connected with an output terminal OUT of a shift register unit in a previous stage before each of other stages of shift register units.

For example, an input terminal INPUT of the first stage of shift register unit can be configured to receive a trigger signal STV, a reset terminal RST of the last stage of shift register unit can be configured to receive a reset signal RESET, and the trigger signal STV and the reset signal RESET are not shown in FIG. 5A.

For example, as shown in FIG. 5A, the gate drive circuit 10 further includes a first clock signal line CLKA and a second clock signal line CLKB. For example, the first clock signal line CLKA is connected with a clock signal terminal CLK of a (2n−1)th stage (n is an integer greater than 0) of shift register unit, and the second clock signal line CLKB is connected with a clock signal terminal CLK of a (2n)th stage of shift register unit. It should be noted that, the embodiments of the disclosure include, but are not limited to the above connection mode, for example, the gate drive circuit 10 may adopt a connection mode that: the first clock signal line CLKA is connected with the clock signal terminal CLK of the (2n)th stage (n is an integer greater than 0) of shift register unit, and the second clock signal line CLKB is connected with the clock signal terminal CLK of the (2n−1)th stage of shift register unit.

For example, as shown in FIG. 5A, the gate drive circuit 10 further includes a timing controller 200. For example, the timing controller 200 can be configured to be connected with the touch start signal line TCA, the first touch stop signal line TCO1, the first clock signal line CLKA and the second clock signal line CLKB, to provide the touch start signal, the first touch stop signal and clock signals to each of the shift register units. For example, the timing controller 200 can further be configured to provide the trigger signal STV and the reset signal RESET.

Figure 5B:
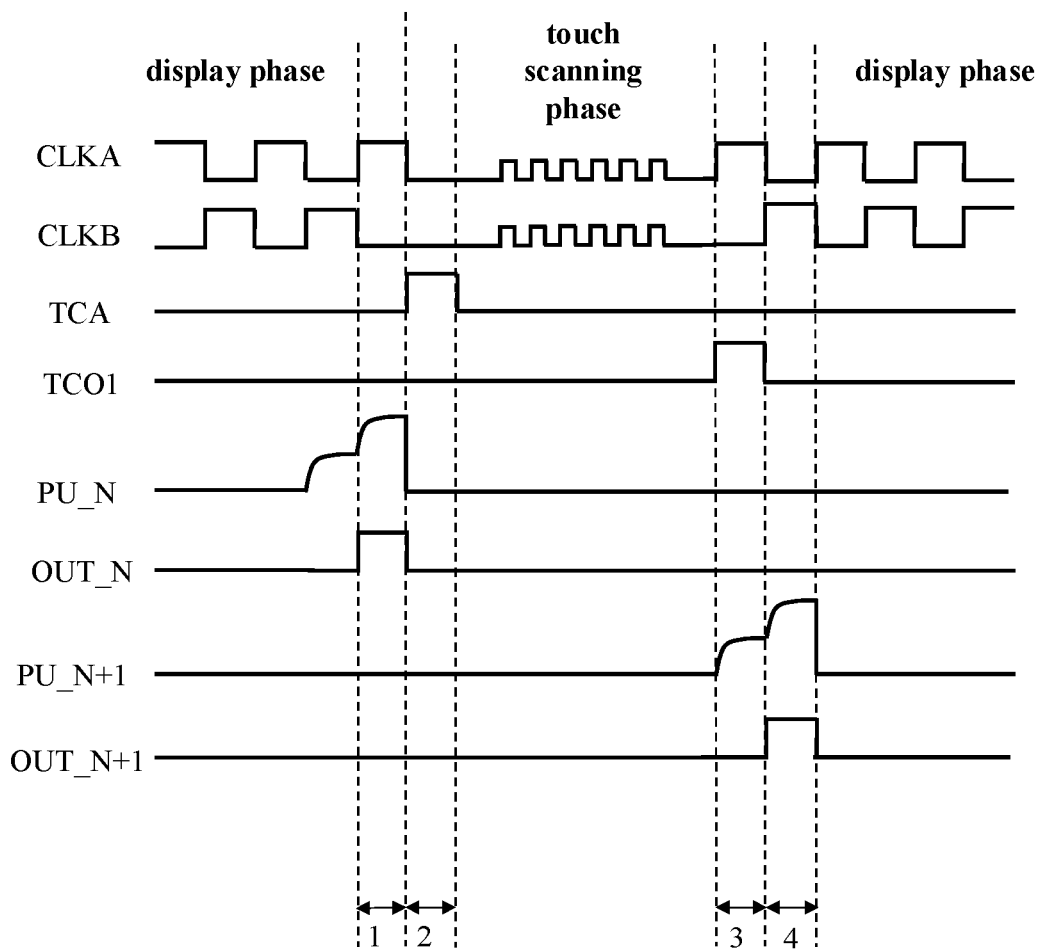
FIG. 5B is a signal timing schematic diagram corresponding to an operation process of the gate drive circuit as shown in FIG. 5A.
Figure 5C:
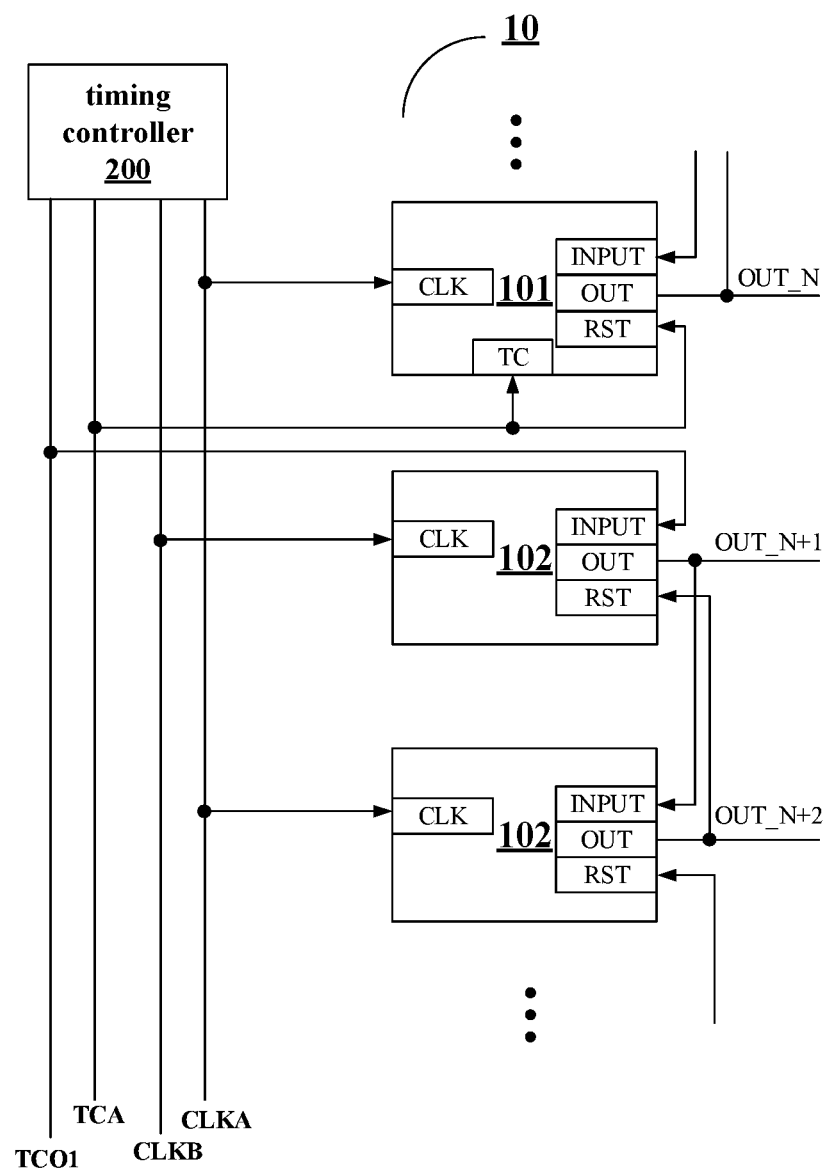
FIG. 5C is a schematic diagram of a gate drive circuit provided by another example of an embodiment of the present disclosure.

For example, clock signal timings provided by the first clock signal line CLKA and the second clock signal line CLKB may employ signal timings as shown in FIG. 5B to implement the function of the gate drive circuit 10 to output the gate scanning signals row by row.

The operation principle of the gate drive circuit 10 as shown in FIG. 5A is described below in combination with a signal timing schematic diagram as shown in FIG. 5B, in four phases including a first phase 1, a second phase 2, a third phase 3 and a fourth phase 4 as shown in FIG. 5B, the gate drive circuit 10 performs the following operations.

It should be noted that, as shown in FIG. 5B, in the present example, a touch scanning phase is inserted between the second phase 2 and the third phase 3.

In the first phase 1, the first clock signal line CLKA provides a high-level signal, and because the clock signal terminal CLK of the (N)th stage of shift register unit 101 is connected with the first clock signal line CLKA, the high-level signal is inputted to the clock signal terminal CLK of the (N)th stage of shift register unit 101 during this phase. And because a first node PU_N of the (N)th stage of shift register unit 101 is at a high level, the high-level signal inputted by the clock signal terminal CLK is outputted to the output terminal OUT_N of the (N)th stage of shift register unit 101 under control of the high level of the first node PU_N. It should be noted that the level of the potential of the signal timing schematic diagram as shown in FIG. 5B is only illustrative and does not represent a true potential value.

In the second phase 2, the touch start signal line TCA provides a high-level signal, because the touch start terminal TC of the (N)th stage of shift register unit 101 is connected with the touch start signal line TCA, the high-level signal is inputted to the touch start terminal TC of the (N)th stage of shift register unit 101. As shown in FIG. 3A or FIG. 3B, when the touch start terminal TC is inputted with a high level, the first transistor T1 is turned on. The turning on of the first transistor T1 causes the first node the PU (corresponding to the PU_N as shown in FIG. 5B) to be connected with the first voltage terminal VGL, so that the potential of the first node PU is pulled down to a low level. In addition, the low level of the first node PU causes the seventh transistor T7 and the ninth transistor T9 to be turned off, thereby the potential of the second node PD is charged to a high level. The high level of the second node PD causes the eleventh transistor T11 to be turned on, thereby causing the output terminal OUT (corresponding to OUT_N as shown in FIG. 5B) to be connected with the first voltage terminal VGL, so that the potential of the output terminal OUT is pulled down to a low level.

It should be noted that, in a case where the (N)th stage of shift register unit 101 includes the second transistor T2, as shown in FIG. 3B, the high level inputted by the touch start terminal TC can also turn on the second transistor T2, and the potential of the output terminal OUT can be further decreased to be performed noise reduction.

Next, as shown in FIG. 5B, the touch scanning phase is started, and the third phase 3 is entered after the touch scanning phase ends.

In the third phase 3, the first touch stop signal line TCO1 provides a high-level signal, and because the input terminal INPUT of the (N+1)th stage of shift register unit 102 is connected with the first touch stop signal line TCO1, the input terminal INPUT of the (N+1)th stage of shift register unit 102 is inputted with the high-level signal, and the high-level signal can control a level of the first node PU_N+1 of the (N+1)th stage of shift register unit 102, thereby causing the level of the first node PU_N+1 to be charged to a first high level.

In the fourth phase 4, the second clock signal line CLKB provides a high-level signal, and because the clock signal terminal CLK of the (N+1)th stage of shift register unit 102 is connected with the second clock signal line CLKB, the clock signal terminal CLK of the (N+1)th stage of shift register unit 102 is inputted with the high-level signal during this phase. The high-level signal inputted by the clock signal terminal CLK causes the potential of the first node PU_N+1 of the (N+1)th stage of shift register unit 102 to be further pulled up to a second high level. Therefore, the high-level signal inputted by the clock signal terminal CLK is output to the output terminal OUT_N+1 of the (N+1)th stage of shift register unit 102 under control of the high level of the first node PU_N+1.

For example, as shown in FIG. 6A, another example of an embodiment of the present disclosure provides a gate drive circuit 10 that differs from the gate drive circuit 10 as shown in FIG. 5A in that: except that the (N)th stage of shift register unit is the first shift register unit 101, an (M)th stage of shift register unit is also the first shift register unit 101; and the gate drive circuit 10 further includes a second touch stop signal line TCO2.

It should be noted that, OUT_M as shown in FIG. 6A represents an output terminal of the (M)th stage of shift register unit, and OUT_M+1 represents an output terminal of an (M+1)th stage of shift register unit.

For example, as shown in FIG. 6A, the (M)th stage of shift register unit (M is an integer greater than 4, and M>N+2) is the first shift register unit 101. A reset terminal RST and a touch start terminal TC of the (M)th stage of shift register unit 101 are connected with the touch start signal line TCA to receive the touch start signal. An input terminal INPUT of the (M+1)th stage of shift register unit 102 is connected with the second touch stop signal line TCO2 to receive a second touch stop signal.

Connection relationships of the (N)th stage, the (N+1)th stage and the (N+2)th stage of shift register unit may refer to the connection relationships as shown in FIG. 5A, and details are not described herein again.

For example, as shown in FIG. 6A, except a last stage of shift register unit, the (N)th stage of shift register unit and the (M)th stage of shift register unit, a reset terminal RST of each of other stages of shift register units is connected with an output terminal OUT of a shift register unit in a next stage after each of other stages of shift register units. Except a first stage of shift register unit, the (N+1)th stage of shift register unit and the (M+1)th stage of shift register unit, an input terminal of each of other stages of shift register units is connected with an output terminal of a shift register unit in a previous stage before each of other stages of shift register units.

For example, an input terminal INPUT of the first stage of shift register unit can be configured to receive a trigger signal STV, a reset terminal of the last stage of shift register unit can be configured to receive a reset signal RESET, and the trigger signal STV and the reset signal RESET are not shown in FIG. 6A.

For example, as shown in FIG. 5A, the gate drive circuit 10 as shown in FIG. 6A further includes a first clock signal line CLKA and a second clock signal line CLKB. For example, the first clock signal line CLK is connected with a clock signal terminal CLK of a (2n−1)th stage of shift register unit (n is an integer greater than 0), and the second clock signal line CLKB is connected with a clock signal terminal CLK of a (2n)th stage of shift register unit. It should be noted that, the embodiments of the disclosure include, but are not limited to the above connection mode, for example, the gate drive circuit 10 may adopt a connection mode that: the first clock signal line CLK is connected with the clock signal terminal CLK of the (2n)th stage (n is an integer greater than 0) of the shift register units, and the second clock signal line CLKB is connected with the clock signal terminal CLK of the (2n−1)th stage of shift register unit.

For example, as shown in FIG. 6A, the gate drive circuit 10 further includes a timing controller 200. For example, the timing controller 200 can be configured to be connected with the touch start signal line TCA, the first touch stop signal line TCO1, the second touch stop signal line TCO2, the first clock signal line CLKA and the second clock signal line CLKB to provide the touch start signal, the first touch strop signal, the second touch stop signal, and clock signals to each of the shift register units. For example, the timing controller 200 can further be configured to provide the trigger signal STV and the reset signal RESET.

Figure 6B:
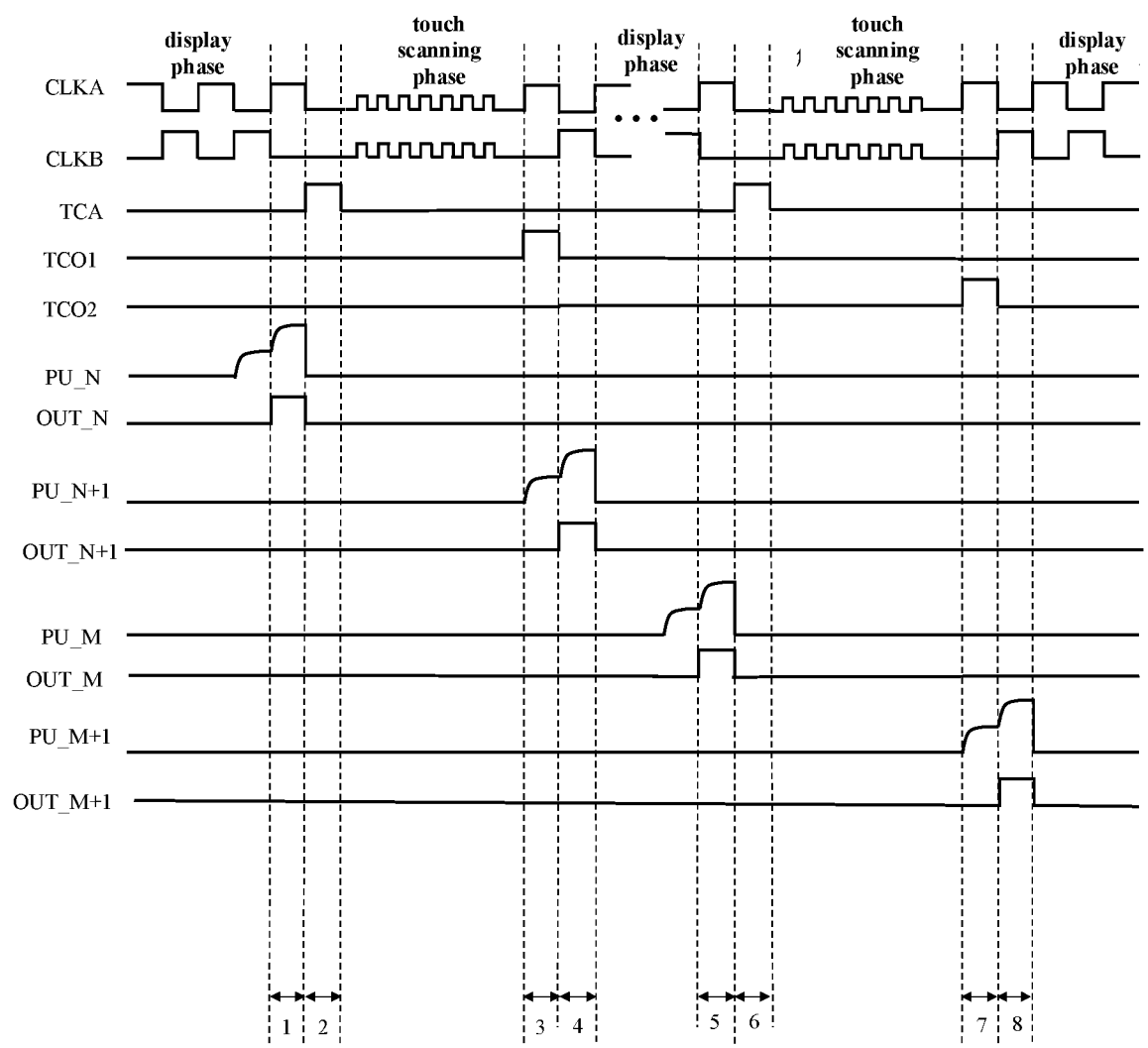
FIG. 6B is a signal timing schematic diagram corresponding to an operation process of the gate drive circuit as shown in FIG. 6A.

For example, the clock signal timings provided by the first clock signal line CLKA and the second clock signal line CLKB may employ signal timings as shown in FIG. 6B to implement the function of the gate drive circuit 10 to output the gate scanning signals row by row.

The operation principle of the gate drive circuit 10 as shown in FIG. 6A is described below in combination with a signal timing schematic diagram as shown in FIG. 6B, in eight phases from a first phase 1 to an eighth phase 8 as shown in FIG. 6B, the gate drive circuit 10 performs the following operations.

It should be noted that, as shown in FIG. 6B, in the present example, one touch scanning phase is inserted between a second phase 2 and a third phase 3, and another touch scanning phase is inserted between a sixth phase 6 and a seventh phase 7.

In the first phase 1, the first clock signal line CLKA provides a high-level signal, and because the clock signal terminal CLK of the (N)th stage of shift register unit 101 is connected with the first clock signal line CLKA, the clock signal terminal CLK of the (N)th stage of shift register unit 101 is inputted with the high-level signal during this phase. And because a first node PU_N of the (N)th stage of shift register unit 101 is at a high level, the high-level signal inputted by the clock signal terminal CLK is output to the output terminal OUT_N of the (N)th stage of shift register unit 101 under control of the high level of the first node PU_N. It should be noted that the level of the potential of the signal timing schematic diagram as shown in FIG. 6B is only illustrative and does not represent a true potential value.

In a second phase 2, the touch start signal line TCA provides a high-level signal. Because the touch start terminal TC of the (N)th stage of shift register unit 101 is connected with the touch start signal line TCA, the touch start terminal TC of the (N)th stage of shift register unit 101 is inputted with the high-level signal. As shown in FIG. 3A or FIG. 3B, when the touch start terminal TC is inputted with a high level, the first transistor T1 is turned on. The turning on of the first transistor T1 causes the first node PU (corresponding to the PU_N as shown in FIG. 6B) to be connected with the first voltage terminal VGL, so that the potential of the first node PU is pulled down to a low level. In addition, the low level of the first node PU causes the seventh transistor T7 and the ninth transistor T9 to be turned off, thereby the potential of the second node PD is charged to a high level. The high level of the second node PD causes the eleventh transistor T11 to be turned on, thereby causing the output terminal OUT (corresponding to OUT_N as shown in FIG. 6B) to be connected with the first voltage terminal VGL, so that the potential of the output terminal OUT is pulled down to a low level.

It should be noted that, in a case where the (N)th stage of shift register unit 101 includes the second transistor T2, as shown in FIG. 3B, the high level inputted by the touch start terminal TC can also turn on the second transistor T2, and the potential of the output terminal OUT can be further decreased to be performed noise reduction.

Next, as shown in FIG. 6B, the touch scanning phase is started, and the third phase 3 is entered after the touch scanning phase ends.

In a third phase 3, the first touch stop signal line TCO1 provides a high-level signal, and because the input terminal INPUT of the (N+1)th stage of shift register unit 102 is connected with the first touch stop signal line TCO1, the input terminal INPUT of the (N+1)th stage of shift register unit 102 is inputted with the high-level signal, and the high-level signal can control the level of the first node PU_N+1 of the (N+1)th stage of shift register unit 102, thereby causing the level of the first node PU_N+1 to be charged to a first high level.

In a fourth phase 4, the second clock signal line CLKB provides a high-level signal, and because the clock signal terminal CLK of the (N+1)th stage of shift register unit 102 is connected with the second clock signal line CLKB, the clock signal terminal CLK of the (N+1)th stage of shift register unit 102 is inputted with the high-level signal during this phase. The high-level signal inputted by the clock signal terminal CLK causes the potential of the first node PU_N+1 of the (N+1)th stage of shift register unit 102 to be further pulled up to a second high level. Therefore, the high-level signal inputted by the clock signal terminal CLK is output to the output terminal OUT_N+1 of the (N+1)th stage of shift register unit 102 under control of the high level of the first node PU_N+1.

In the fifth phase 5, the first clock signal line CLKA provides a high-level signal, and because the clock signal terminal CLK of the (M)th stage of shift register unit 101 is connected with the first clock signal line CLKA, the clock signal terminal CLK of the (M)th stage of shift register unit 101 is inputted with the high-level signal during this phase. And because a first node PU_M of the (M)th stage of shift register unit 101 is at a high level, the high-level signal inputted by the clock signal terminal CLK is output to the output terminal OUT_M of the (M)th stage of shift register unit 101 under control of the high level of the first node PU_M.

In a sixth phase 6, the touch start signal line TCA provides a high-level signal. Because the touch start terminal TC of the (M)th stage of shift register unit 101 is connected with the touch start signal line TCA, the touch start terminal TC of the (M)th stage of shift register unit 101 is inputted with the high-level signal. As shown in FIG. 3A or FIG. 3B, when the touch start terminal TC is inputted with a high level, the first transistor T1 is turned on. The turning on of the first transistor T1 causes the first node PU (corresponding to the PU_M as shown in FIG. 6B) to be connected with the first voltage terminal VGL, so that the potential of the first node PU is pulled down to a low level. In addition, the low level of the first node PU causes the seventh transistor T7 and the ninth transistor T9 to be turned off, thereby the potential of the second node PD is charged to a high level. The high level of the second node PD causes the eleventh transistor T11 to be turned on, thereby causing the output terminal OUT (corresponding to OUT_M as shown in FIG. 6B) to be connected with the first voltage terminal VGL, so that the potential of the output terminal OUT is pulled down to a low level.

It should be noted that, in a case where the (M)th stage of shift register unit 101 includes the second transistor T2, as shown in FIG. 3B, the high level inputted by the touch start terminal TC can also turn on the second transistor T2, and the potential of the output terminal OUT can be further decreased to be performed noise reduction.

Next, as shown in FIG. 6B, the touch scanning phase is started, and a seventh phase 7 is entered after the touch scanning phase ends.

In a seventh phase 7, the second touch stop signal line TCO2 provides a high-level signal, and because the input terminal INPUT of the (M+1)th stage of shift register unit 102 is connected with the second touch stop signal line TCO2, the input terminal INPUT of the (M+1)th stage of shift register unit 102 is inputted with the high-level signal, and the high-level signal can control the level of the first node PU_M+1 of the (M+1)th stage of shift register unit 102, thereby causing the level of the first node PU_M+1 to be charged to the first high level.

In the eighth phase 8, the second clock signal line CLKB provides a high-level signal, and because the clock signal terminal CLK of the (M+1)th stage of shift register unit 102 is connected with the second clock signal line CLKB, the clock signal terminal CLK of the (M+1)th stage of shift register unit 102 is inputted with the high-level signal during this phase. The high-level signal inputted by the clock signal terminal CLK causes the potential of the first node PU_M+1 of the (M+1)th stage of shift register unit 102 to be further pulled up to the second high level. Therefore, the high-level signal inputted by the clock signal terminal CLK is output to the output terminal OUT_M+1 of the (M+1)th stage of shift register unit 102 under control of the high level of the first node PU_M+1.

It should be noted that, the embodiments of the present disclosure are described by taking a case that a touch scanning phase (for example, as shown in FIG. 5B) or two touch scanning phases (for example, as shown in FIG. 6B) are inserted in the display phase of a frame of image as an example. The embodiments of the present disclosure include, but are not limited to this case, for example, 3, 4, 5 or more touch scanning phases may also be inserted in the display phase of a frame of image. In this case, more first shift register units 101 and more touch scan stop signal lines need to be set correspondingly.

For example, in a specific example, six touch scanning phases can be inserted in the display phase of a frame of image, and each touch scanning phase can complete, for example, the touch scanning of a ⅓ area of the display panel, so that the touch report rate can be increased to two times of the display frame rate. For example, in a case where the display frame rate is 60 Hz, the touch report rate can be increased to 120 Hz in this case.

The gate drive circuit 10 provided by the present embodiment can control the level of the first node PU by the touch noise reduction circuit. In one aspect, the level of the first node PU can be kept in the low-level state during the touch scanning phase, so that the output terminal OUT of the shift register unit can be prevented from outputting abnormally affected by a clock signal, and interferences, which are caused by the outputting abnormally of the output terminal OUT of the shift register unit to a touch scanning signal, can be avoided. In another aspect, the level of the first node PU can be charged to a high-level state after the end of the touch scanning phase, thereby the output abnormality caused by the too low level of the first node PU of the first shift register unit after the end of the touch scanning phase can be avoided, and thereby improving the display quality.

Figure 7:
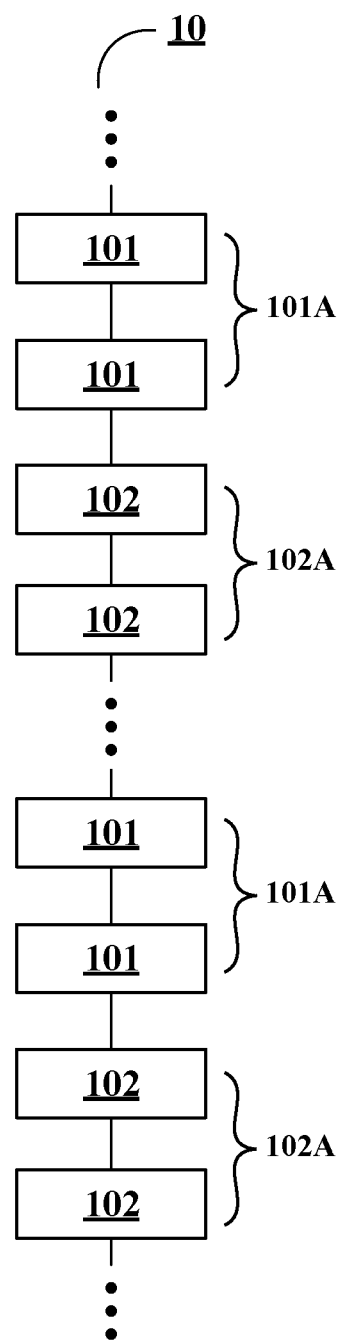
FIG. 7 is a schematic diagram of a gate drive circuit provided by an embodiment of the present disclosure.

An embodiment of the present disclosure further provides a gate drive circuit 10. As shown in FIG. 7, the gate drive circuit 10 includes a plurality of cascaded shift register units. For example, the plurality of shift register units include P first shift register units 101 and a plurality of shift register units 102. For example, the first shift register unit 101 adopts the shift register unit 100 provided by the embodiment of the present disclosure, for example, the shift register unit as shown in FIG. 3A and FIG. 3B.

For example, the P first shift register units 101 include Q (P=−2Q, and Q is an integer greater than 0) first shift register unit groups 101A, and each of the Q first shift register unit groups 101A includes two adjacent cascaded first shift register units. For example, the gate drive circuit 10 further includes Q second shift register unit groups 102A, and each of the Q second shift register unit groups 102A includes two shift register units, which are cascaded with each of the Q first shift register unit groups, after each of the Q first shift register unit groups 101A.

It should be noted that only two first shift register unit groups 101A and two second shift register unit groups 102A are schematically illustrated in FIG. 7, and the embodiments of the present disclosure include but are not limited thereto.

Figure 8A:
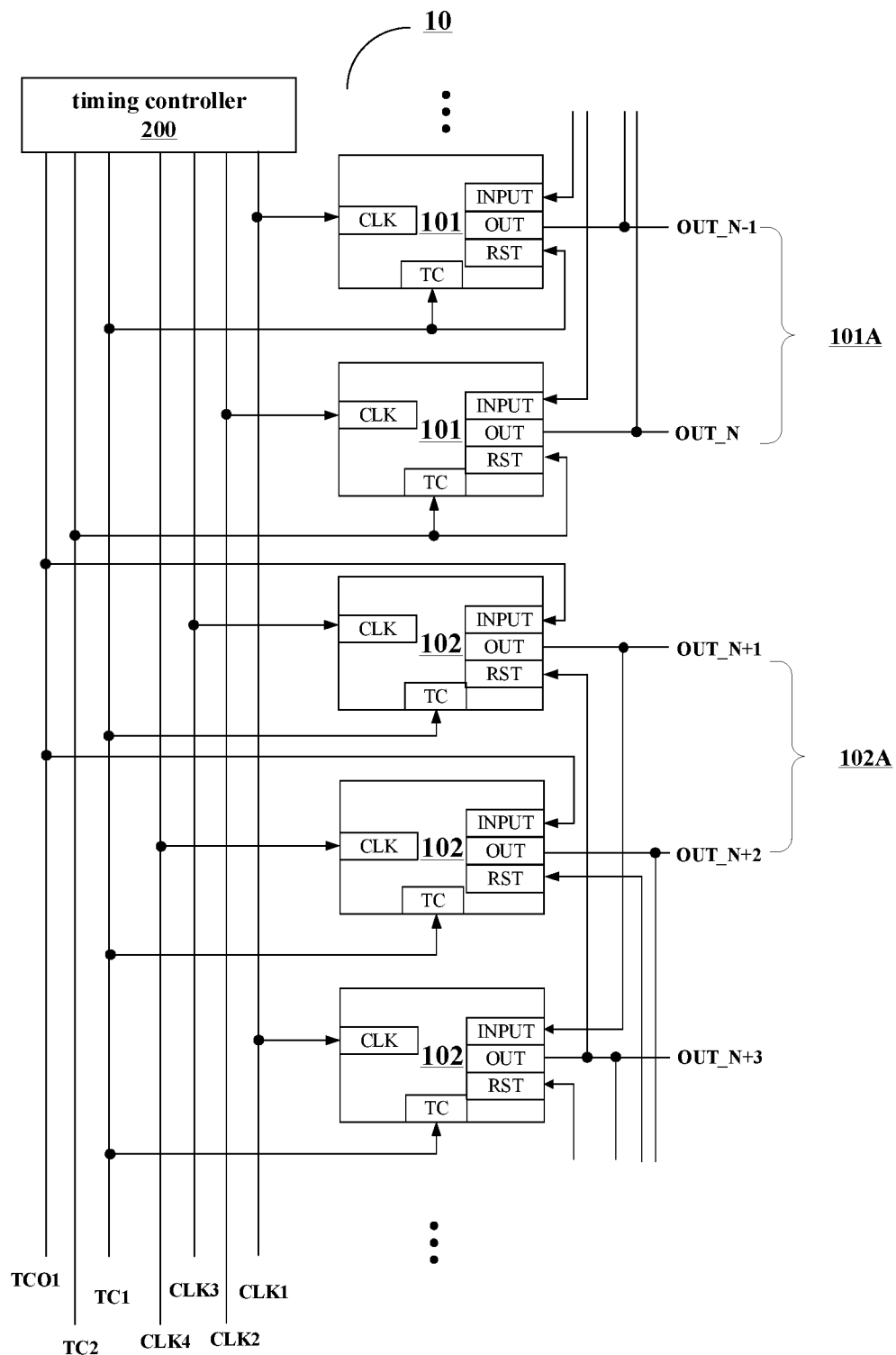
FIG. 8A is a schematic diagram of a gate drive circuit provided by an example of an embodiment of the present disclosure.

For example, the gate drive circuit 10 as shown in FIG. 7 further includes a first touch start signal line, a second touch start signal line and Q touch stop signal lines, which are not shown in FIG. 7. It should be noted that a number of the touch stop signal lines is consistent with a number of the first shift register unit groups 101A. For example, in an example, as shown in FIG. 8A, the gate drive circuit 10 includes one first shift register unit group 101A, and correspondingly need to set one touch stop signal line such as a first touch stop signal line TCO1. For another example, as shown in FIG. 9A, the gate drive circuit 10 includes two first shift register unit groups 101A, and correspondingly need to set two touch stop signal lines, such as a first touch stop signal line TCO1 and a second touch stop signal line TCO2.

For example, in the gate drive circuit 10 provided by the above-described example, in a case where the gate drive circuit 10 includes the first touch start signal line, the second touch start signal line and Q touch stop signal lines, a reset terminal of an earlier stage of shift register unit in each of the Q first shift register unit groups 101A and a touch start terminal of an earlier stage of shift register unit in each of the Q first shift register unit groups 101A are connected with the first touch start signal line to receive a first touch start signal; and a reset terminal of an later stage of shift register unit in each of the Q first shift register unit groups 101A and a touch start terminal of an later stage of shift register unit in each of the Q first shift register unit groups 101A are connected with the second touch start signal line to receive a second touch start signal. Input terminals of the two shift register units of each of the Q second shift register unit groups 102A are connected with a same one of the Q touch stop signal lines, and input terminals of shift register units of different second shift register unit groups are connected with different touch stop signal lines.

Figure 9A:
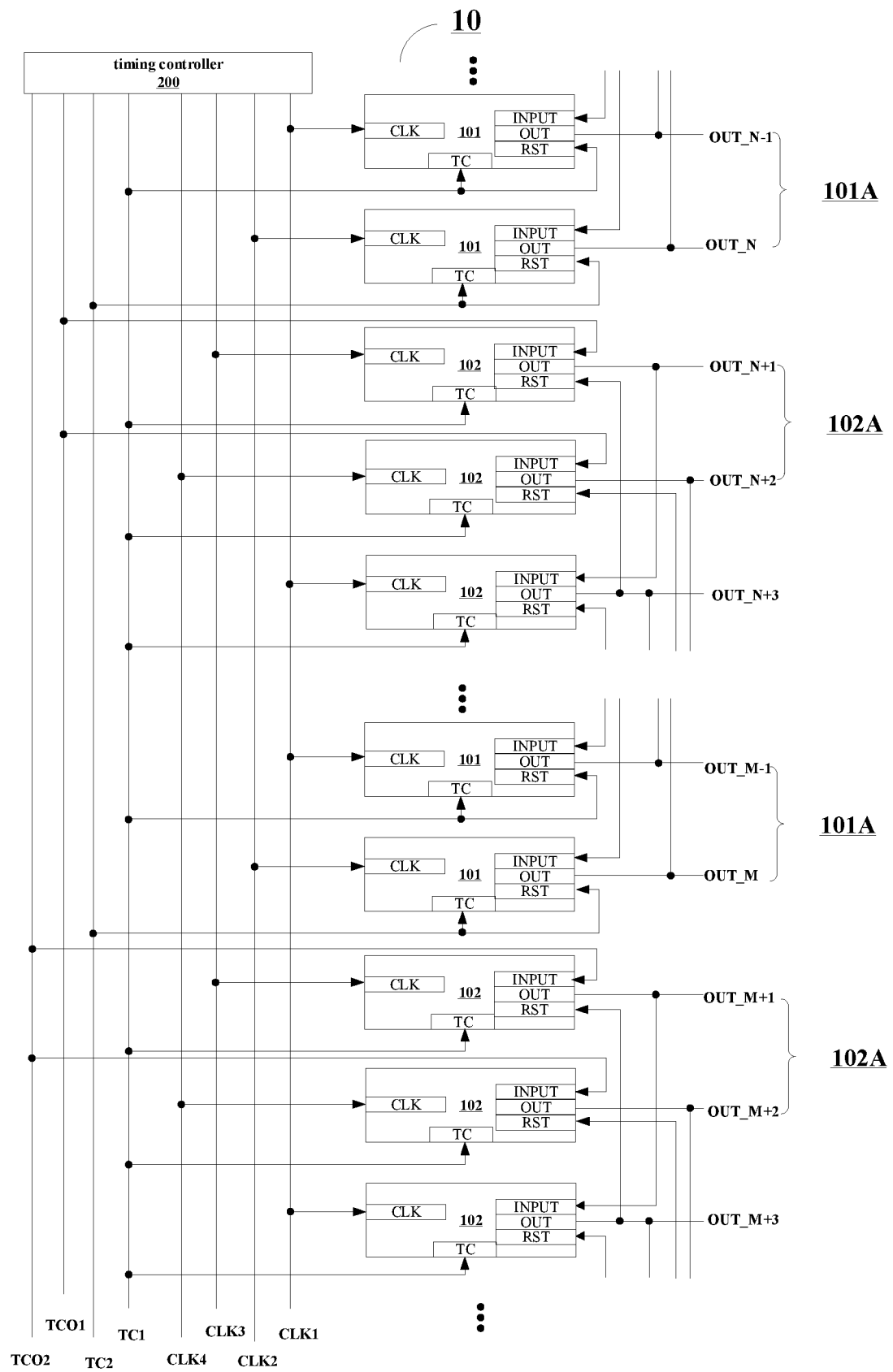
FIG. 9A is a schematic diagram of a gate drive circuit provided by another example of an embodiment of the present disclosure.

The connection relationships between the touch start signal line and each stage of shift register unit in the gate drive circuit 10, the connection relationships between the touch stop signal line and each stage of shift register unit in the gate drive circuit 10, and the operation principle of the gate drive circuit 10 will be described below with reference to an examples as shown in FIG. 8A and FIG. 9A.

For example, as shown in FIG. 8A, an example of an embodiment of the present disclosure provides a gate drive circuit 10 including a plurality of cascaded shift register units, a first touch start signal line TC1, a second touch start signal line TC2 and a first touch stop signal line TCO1. For example, the plurality of cascaded shift register units include two first shift register units 101 and a plurality of shift register units 102.

For example, as shown in FIG. 8A, the (N−1)th stage of shift register unit (N is an integer greater than 2) and the (N)th stage of shift register unit are the first shift register unit 101. A reset terminal RST and a touch start terminal TC of the (N−1)th stage of shift register unit are connected with the first touch start signal line TC1 to receive the first touch start signal. A reset terminal RST and a touch start terminal TC of the (N)th stage of shift register unit are connected with the second touch start signal line TC2 to receive the second touch start signal. An input terminal INPUT of the (N+1)th stage and an input terminal INPUT of the (N+2)th stage of shift register unit 102 are connected with the first touch stop signal line TCO1 to receive the first touch stop signal.

It should be noted that the shift register unit 102 as shown in FIG. 8A includes a touch start terminal TC, and in this case, the touch start terminal TC of the shift register unit 102 is connected with the first touch start signal line TC1 or the second touch start signal line TC2. The embodiments of the present disclosure include, but are not limited to this case, for example, the shift register unit 102 may not include the touch start terminal TC, in which case the shift register unit 102 does not need to be connected with the touch start signal line (the first touch start signal line TC1 or the second touch start signal line TC2).

For example, as shown in FIG. 8A, except last two stages of shift register units, the (N−1)th stage of shift register unit and the (N)th stage of shift register unit, a reset terminal of each of other stages of shift register units is connected with an output terminal of a next stage of shift register unit separated by one stage after each of other stages of shift register units. Except a first stage of shift register unit, a second stage of shift register unit, the (N+1)th stage of shift register unit and the (N+2)th stage of shift register unit, an input terminal of each of other stages of shift register units is connected with an output terminal of a previous stage of shift register unit separated by one stage before the each of other stages of shift register units.

It should be noted that, in the embodiments of the present disclosure, one shift register unit B is a next or latter stage of shift register unit of another shift register unit A represents that: the gate scanning signal outputted by the shift register unit B is later than the gate scanning signal outputted by the shift register unit A in timing. One shift register unit B is a previous stage or an earlier stage shift register unit of another shift register unit A represents that: the gate scanning signal outputted by the shift register unit B is earlier than the gate scanning signal outputted by the shift register unit A in timing. The following embodiments are the same as those described herein and will not be described again.

For example, an input terminal INPUT of the first stage of shift register unit can be configured to receive the trigger signal STV, a reset terminal RST of the last stage of shift register unit can be configured to receive the reset signal RESET, and the trigger signal STV and the reset signal RESET are not shown in FIG. 8A.

For example, as shown in FIG. 8A, the gate drive circuit 10 further includes a first clock signal line CLK1, a second clock signal line CLK2, a third clock signal line CLK3 and a fourth clock signal line CLK4. For example, the first clock signal line CLK1 is connected with a clock signal terminal of a (4n−3)th stage of shift register unit (n is an integer greater than 0), the second clock signal line CLK2 is connected with a clock signal terminal of a (4n−2)th stage of shift register unit, the third clock signal line CLK3 is connected with a clock signal terminal of a (4n−1)th stage of shift register unit, and the fourth clock signal line CLK4 is connected with a clock signal terminal of a (4n)th stage of the shift register unit.

For example, as shown in FIG. 8A, the gate drive circuit 10 further includes a timing controller 200. For example, the timing controller 200 can be configured to be connected with the first touch start signal line TC1, the second touch start signal line TC2, the first touch stop signal line TCO1, the first clock signal line CLK1, the second clock signal line CLK2, the third clock signal line CLK3 and the fourth clock signal line CLK4, to provide the first touch start signal, the second touch start signal, the first touch stop signal and clock signals to each of the shift register units. The timing controller 200 can further be configured to provide the trigger signal STV and the reset signal RESET.

Figure 8B:
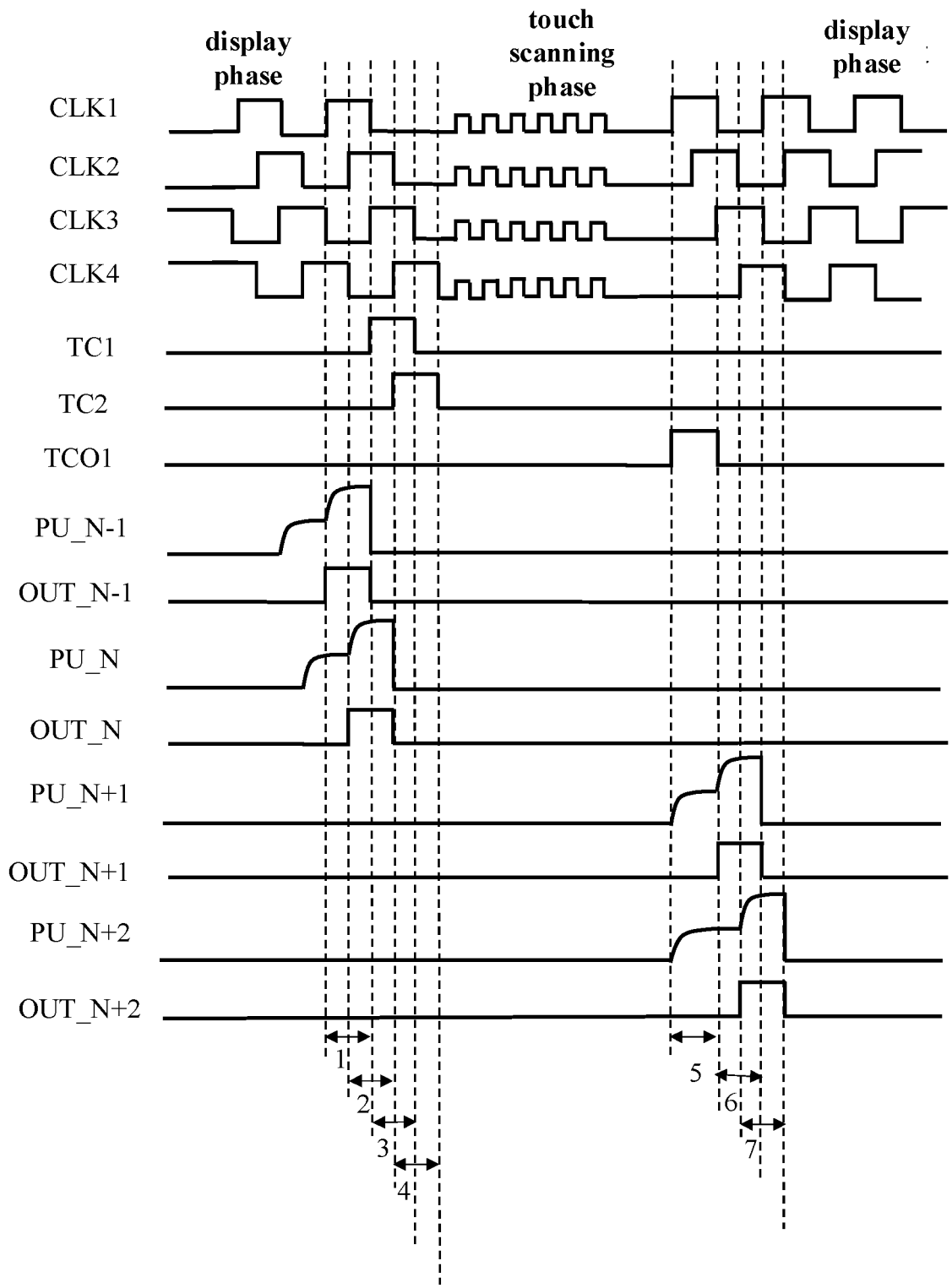
FIG. 8B is a signal timing schematic diagram corresponding to an operation process of the gate drive circuit as shown in FIG. 8A.

For example, the clock signal timings provided by the first clock signal line CLK1, the second clock signal line CLK2, the third clock signal line CLK3 and the fourth clock signal line CLK4 may employ the signal timings as shown in FIG. 8B to implement the function of the gate drive circuit 10 to output the gate scanning signals row by row.

The clock signal on the clock signal line will be attenuated during the process of transmission, which may cause insufficient charging voltage to the subsequent gate lines. By providing clock signals to the shift register units of the gate drive circuit through a plurality of clock signal lines, the load on each of clock signal lines can be reduced, thereby increasing the charging rate.

It should be noted that the gate drive circuit provided in the embodiment of the present disclosure may further include six, eight, or more clock signal lines, which are not limited by the embodiments of the present disclosure.

The operation principle of the gate drive circuit 10 as shown in FIG. 8A is described below in combination with a signal timing diagram as shown in FIG. 8B, in seven phases from a first phase 1 to a seventh phase 7 as shown in FIG. 8B, the gate drive circuit 10 performs the following operations.

It should be noted that, as shown in FIG. 8B, in the present example, a touch scanning phase is inserted between a fourth phase 4 and a fifth phase 5.

In the first phase 1, the first clock signal line CLK1 provides a high-level signal, and because the clock signal terminal CLK of the (N−1)th stage of shift register unit 101 is connected with the first clock signal line CLKA, the clock signal terminal CLK of the (N−1)th stage of shift register unit 101 is inputted with the high-level signal during this phase. And because a first node PU_N−1 of the (N−1)th stage of shift register unit 101 is at a high level, the high-level signal inputted by the clock signal terminal CLK is output to the output terminal OUT_N−1 of the (N−1)th stage of shift register unit 101 under control of the high level of the first node PU_N−1. It should be noted that the level of the potential of the signal timing diagram as shown in FIG. 8B is only illustrative and does not represent a true potential value.

In a second phase 2, the second clock signal line CLK2 provides a high-level signal, and because the clock signal terminal CLK of the (N)th stage of shift register unit 101 is connected with the second clock signal line CLK2, the clock signal terminal CLK of the (N)th stage of shift register unit 101 is inputted with the high-level signal during this phase. And because a first node PU_N of the (N)th stage of shift register unit 101 is at a high level, the high-level signal inputted by the clock signal terminal CLK is output to the output terminal OUT_N of the (N)th stage of shift register unit 101 under control of the high level of the first node PU_N.

In a third phase 3, the first touch start signal line TC1 provides a high-level signal. Because the touch start terminal TC of the (N−1)th stage of shift register unit 101 is connected with the first touch start signal line TC1, the touch start terminal TC of the (N−1)th stage of shift register unit 101 is inputted with the high-level signal. When the touch start terminal TC is inputted with a high level, a potential of the first node PU_N−1 and a potential of the output terminal OUT_N−1 of the (N−1)th stage of shift register unit 101 are pulled down to a low level. The working principle in this phase may refer to the corresponding description in the second phase 2 in FIG. 5B, and details are not described herein again.

In the fourth phase 4, the second touch start signal line TC2 provides a high-level signal. Because the touch start terminal TC of the (N)th stage of shift register unit 101 is connected with the second touch start signal line TC2, the touch start terminal TC of the (N)th stage of shift register unit 101 is inputted with the high-level signal. When the touch start terminal TC is inputted with a high level, the potentials of the first node PU_N and the output terminal OUT_N of the (N)th stage of shift register unit 101 are pulled down to a low level. The working principle in this phase may refer to the corresponding description in the second phase 2 in FIG. 5B, and details are not described herein again.

Next, as shown in FIG. 8B, the touch scanning phase is started, and the fifth phase 5 is entered after the touch scanning phase ends.

In the fifth phase 5, the first touch stop signal line TCO1 provides a high-level signal, and because an input terminal INPUT of the (N+1)th stage and an input terminal INPUT of the (N+2)th stage of shift register unit 102 are connected with the first touch stop signal line TCO1, the input terminal INPUT of the (N+1)th stage and the input terminal INPUT of the (N+2)th stage of shift register unit 102 are inputted with the high-level signal, and the high-level signal can control a level of the first node PU_N+1 of the (N+1)th stage of shift register unit 102 and control a level of the first node PU_N+2 of the (N+2)th stage of shift register unit 102, thereby causing the level of the first node PU_N+1 and the level of the first node PU_N+2 to be charged to a first high level.

In a sixth phase 6, the third clock signal line CLK3 provides a high-level signal, and because a clock signal terminal CLK of the (N+1)th stage of shift register unit 102 is connected with the third clock signal line CLK3, the clock signal terminal CLK of the (N+1)th stage of shift register unit 102 is inputted with the high-level signal during this phase. The high-level signal inputted by the clock signal terminal CLK causes a potential of the first node PU_N+1 of the (N+1)th stage of shift register unit 102 to be further pulled up to a second high level. Therefore, the high-level signal inputted by the clock signal terminal CLK is output to the output terminal OUT_N+1 of the (N+1)th stage of shift register unit 102 under control of the high level of the first node PU_N+1.

In the seventh phase 7, the fourth clock signal line CLK4 provides a high-level signal, and because a clock signal terminal CLK of the (N+2)th stage of shift register unit 102 is connected with the fourth clock signal line CLK4, the clock signal terminal CLK of the (N+2)th stage of shift register unit 102 is inputted with the high-level signal during this phase. The high-level signal inputted by the clock signal terminal CLK causes a potential of the first node PU_N+2 of the (N+2)th stage of shift register unit 102 to be further pulled up to a second high level. Therefore, the high-level signal inputted by the clock signal terminal CLK is output to the output terminal OUT_N+2 of the (N+2)th stage of shift register unit 102 under control of the high level of the first node PU_N+2.

For example, as shown in FIG. 9A, another example of an embodiment of the present disclosure provides a gate drive circuit 10 that differs from the gate drive circuit 10 as shown in FIG. 8A in that: except that the (N−1)th stage of shift register unit and the (N)th stage of shift register unit are the first shift register unit 101, an (M−1)th stage of shift register unit and an (M)th stage of shift register unit are also the first shift register unit 101; and the gate drive circuit 10 further includes a second touch stop signal line TCO2.

It should be noted that, OUT_M−1 as shown in FIG. 9A represents an output terminal of the (M−1)th stage of shift register unit, OUT_M represents an output terminal of the (M)th stage of shift register unit, OUT_M+1 represents an output terminal of an (M+1)th stage of shift register unit, OUT_M+2 represents an output terminal of the (M+2)th stage of shift register unit, and OUT_M+3 represents an output terminal of the (M+3)th-stage of shift register unit.

For example, as shown in FIG. 9A, the (M−1)th stage of shift register unit (M is an integer greater than 6, and M>N+3) and the (M)th stage of shift register unit are the first shift register unit 101. A reset terminal RST and a touch start terminal TC of the (M−1)th stage of shift register unit 101 are connected with the first touch start signal line TC1 to receive the first touch start signal. A reset terminal RST and a touch start terminal TC of the (M)th stage of shift register unit 101 are connected with the second touch start signal line TC2 to receive the second touch start signal. The input terminal INPUT of the (M+1)th stage and The input terminal INPUT of the (M+2)th stage of shift register unit 102 are connected with the second touch stop signal line TCO2 to receive a second touch stop signal.

The connection relationships of the (N−1)th stage of shift register unit, the (N)th stage of shift register unit, the (N+1)th stage of shift register unit and the (N+2)th stage of shift register unit may be referred to FIG. 8A, and details are not described herein again.

For example, as shown in FIG. 9A, except last two stages of the shift register units, the (N−1)th stage of shift register unit, the (M−1)th stage of shift register unit, the (N)th stage of shift register unit and the (M)th stage of shift register unit, a reset terminal of each of other stages of shift register units is connected with an output terminal of a next stage of shift register unit separated by one stage after the each of other stages of shift register units. Except a first stage of shift register unit, a second stage of shift register unit, the (N+1)th stage of shift register unit, the (M+1)th stage of shift register unit, the (N+2)th stage of shift register unit and the (M+2)th stage of shift register unit, an input terminal of each of other stages of shift register units is connected with an output terminal of a previous stage of shift register unit separated by one stage before the each of other stages of shift register units.

For example, the input terminal INPUT of the first stage of shift register unit can be configured to receive the trigger signal STV, the reset terminal RST of the last stage of shift register unit can be configured to receive the reset signal RESET, and the trigger signal STV and the reset signal RESET are not shown in FIG. 9A.

For example, as shown in FIG. 8A, the gate drive circuit 10 as shown in FIG. 9A further includes a first clock signal line CLK1, a second clock signal line CLK2, a third clock signal line CLK3 and a fourth clock signal line CLK4. For example, the first clock signal line CLK1 is connected with a clock signal terminal of a (4n−3)th stage of shift register unit (n is an integer greater than 0), the second clock signal line CLK2 is connected with a clock signal terminal of a (4n−2)th stage of shift register unit, the third clock signal line CLK3 is connected with a clock signal terminal of a (4n−1)th stage of shift register unit, and the fourth clock signal line CLK4 is connected with a clock signal terminal of a (4n)th stage of the shift register unit.

For example, as shown in FIG. 9A, the gate drive circuit 10 further includes a timing controller 200. For example, the timing controller 200 can be configured to be connected with the first touch start signal line TC1, the second touch start signal line TC2, the first touch stop signal line TCO1, the second touch stop signal line TCO2, the first clock signal line CLK1, the second clock signal line CLK2, the third clock signal line CLK3 and the fourth clock signal line CLK4, to provide the first touch start signal, the second touch start signal, the first touch stop signal, the second touch stop signal and clock signals to each of the shift register units. The timing controller 200 can further be configured to provide the trigger signal STV and the reset signal RESET.

Figure 9B:
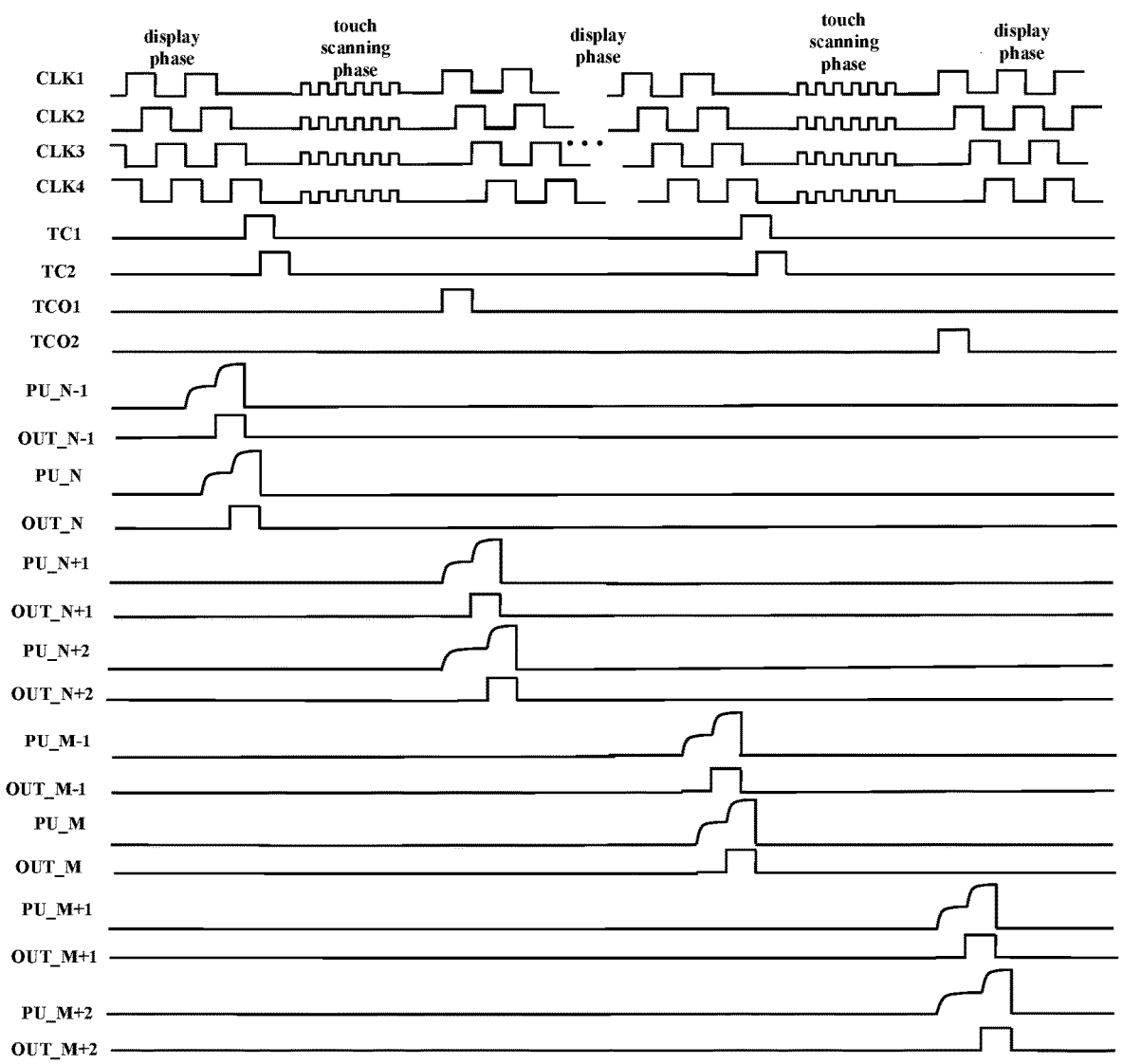
FIG. 9B is a signal timing schematic diagram corresponding to an operation process of the gate drive circuit as shown in FIG. 9A.

FIG. 9B is a signal timing schematic diagram of the gate drive circuit 10 as shown in FIG. 9A. It should be noted that the working principle of the gate drive circuit 10 as shown in FIG. 9A can be referred to the corresponding description in the gate drive circuit 10 as shown in FIG. 8A, and details are not described herein again.

It should be noted that, the embodiments of the present disclosure are described by taking a case that a touch scanning phase (for example, as shown in FIG. 8B) or two touch scanning phases (for example, as shown in FIG. 9B) are inserted in the display phase of a frame of image as an example. The embodiments of the present disclosure include, but are not limited to this case, for example, 3, 4, 5 or more touch scanning phases may also be inserted in the display phase of a frame of image. In this case, more first shift register unit groups 101A, more second shift register unit groups 102A and more touch scan stop signal lines need to be set correspondingly.

The gate drive circuit 10 provided by the present embodiment can control the level of the first node PU by the touch noise reduction circuit. In one aspect, the level of the first node PU can be kept in the low-level state during the touch scanning phase, so that the output terminal OUT of the shift register unit can be prevented from outputting abnormally affected by a clock signal, and the interferences, which are caused by the outputting abnormally of the output terminal OUT of the shift register unit to a touch scanning signal, can be avoided. In another aspect, the level of the first node PU can be charged to a state of high level after the end of the touch scanning phase, thereby the output abnormality caused by the too low level of the first node PU of the first shift register unit after the end of the touch scanning phase can be avoided, and thereby improving the display quality.

It should be noted that in a case where the gate drive circuit 10 provided by the embodiment of the present disclosure drives a display panel, the gate drive circuit 10 can be disposed on one side of the display panel. For example, the display panel includes a plurality of rows of gate lines, and the output terminals of the shift register units of the gate drive circuit 10 can be configured to be sequentially connected with the plurality of rows of gate lines for outputting gate scanning signals. It should be noted that the gate drive circuit 10 can be separately disposed on both sides of the display panel to implement bilateral driving. The embodiment of the present disclosure does not limit the manner in which the gate drive circuit 10 is disposed.

Figure 10:
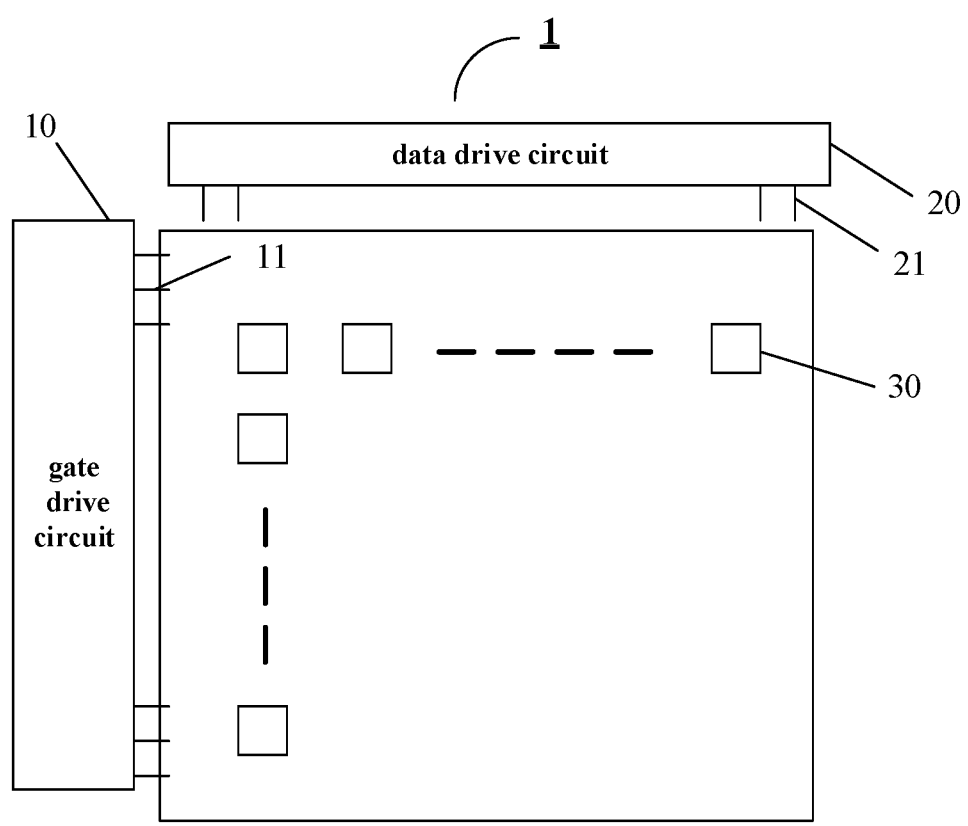
FIG. 10 is a schematic diagram of a display device provided by an embodiment of the present disclosure.

The embodiment of the present disclosure further provides a display device 1, as shown in FIG. 10, the display device 1 includes the gate drive circuit 10 provided by the embodiment of the present disclosure. The display device 1 includes a pixel array including a plurality of pixel units 30. For example, the display device 1 further includes a data drive circuit 20. The data drive circuit 20 is configured to provide data signals to the pixel array. The gate drive circuit 10 is configured to provide gate scanning signals to the pixel array. The data drive circuit 20 is electrically connected with the pixel units 30 through data lines 21, and the gate drive circuit 10 is electrically connected with the pixel units 30 through the gate lines 11.

It should be noted that the display device 1 in this embodiment can be a liquid crystal panel, a liquid crystal television, a display, an OLED panel, an OLED television, an electronic paper, a mobile phone, a tablet computer, a notebook computer, a digital photo frame, a navigator and other products or members having display function. The display device 1 further includes other conventional components, such as a display panel, which are not limited by the embodiments of the present disclosure.

The technical effects of the display device 1 provided by the embodiments of the present disclosure can be described with reference to the corresponding descriptions of the gate drive circuit 10 in the above embodiment, and details are not described herein again.

Embodiment of the present disclosure further provides a driving method that can be applied to the shift register unit 100 provided by an embodiment of the present disclosure. For example, the driving method includes that: the input circuit 110 controls the level of the first node PU in response to the input signal; the output circuit 130 outputs the driving signal to the output terminal OUT under control of the level of the first node PU; the first node reset circuit 120 resets the first node PU in response to the reset signal, and the touch noise reduction circuit 140 reset the first node PU in response to the touch start signal.

The embodiment of the present disclosure further provides a driving method that can be applied to the gate drive circuit 10 provided by the embodiment of the present disclosure. For example, the driving method includes: inputting the touch start signal to the touch noise reduction circuit of the first shift register unit to reset the first node of the first shift register unit.

For example, an example of the embodiment of the present disclosure provides a driving method, which includes at least one touch scanning phase, which can be applied to, for example, the gate drive circuit 10 as shown in FIG. 4, for example, an (X)th stage of shift register unit (X is an integer greater than 1) of the gate drive circuit 10 is the first shift register unit 101. The driving method can include the following operations.

In a first phase, an output terminal of the (X)th stage of shift register unit outputs a gate scanning signal.

In a second phase, the touch start signal is inputted through the touch start signal line to reset a first node of the (X)th stage of shift register unit.

The gate drive circuit enters the touch scanning phase.

In a third phase, the touch stop signal is inputted through the touch stop signal line to control a level of a first node of an (X+)th stage of shift register unit.

In a fourth phase, an output terminal of the (X+1)th stage of shift register unit outputs the gate scanning signal.

It should be noted that, for example, in a case where the driving method provided by the present example includes one touch scanning phase, detailed descriptions and technical effects of the driving method can be referred to the corresponding descriptions of the gate drive circuit 10 as shown in FIG. 5A. For example, in a case where the driving method provided in the present example includes two touch scanning phases, the above driving method is performed twice, detailed descriptions and technical effects of the driving method can be referred to the corresponding descriptions of the gate drive circuit 10 as shown in FIG. 6A, and details are not described herein again. It will be readily understood by those skilled in the art that the driving method provided by the present example is repeated multiple times when multiple touch scanning phases are included.

For example, another example of the embodiment of the present disclosure provides a driving method, which includes at least one touch scanning phase, which can be applied to, for example, the gate drive circuit 10 as shown in FIG. 7, for example, a (Y−1)th stage of shift register unit and a (Y)th stage of shift register unit are first shift register unit. The driving method can include the following operations.

In a first phase, an output terminal of the (Y−1)th stage of shift register unit outputs a gate scanning signal.

In a second phase, an output terminal of the (Y)th stage of shift register unit outputs the gate scanning signal.

In a third phase, the first touch start signal is inputted through the first touch start signal line to reset a first node of the (Y−1)th stage of shift register unit.

In a fourth phase, the second touch start signal is inputted through the second touch start signal line to reset a first node of the (Y)th stage of shift register unit.

The gate drive circuit enters the touch scanning phase.

In a fifth phase, the touch stop signal is inputted through the touch stop signal line to control a level of a first node of a (Y+1)th stage of shift register unit and a level of a first node of a (Y+2)th stage of shift register unit.

In a sixth phase, an output terminal of the (Y+1)th stage of shift register unit outputs the gate scanning signal.

In a seventh phase, an output terminal of the (Y+2)th stage of shift register unit outputs the gate scanning signal.

It should be noted that, for example, in a case where the driving method provided by the present example includes one touch scanning phase, detailed descriptions and technical effects of the driving method can be referred to the corresponding descriptions of the gate drive circuit 10 as shown in FIG. 8A, and details are not described herein again. For another example, in a case where the driving method provided by the present example includes multiple touch scanning phases, the above seven stages are repeated multiple times.

What have been described above are only specific implementations of the present disclosure, the protection scope of the present disclosure is not limited thereto. The protection scope of the present disclosure should be based on the protection scope of the claims.

What is claimed is:

1. A shift register unit, comprising an input circuit, a first node reset circuit, an output circuit, a touch noise reduction circuit, a touch noise reduction circuit, a first control circuit, a second control circuit, a first node noise reduction circuit and an output noise reduction circuit, wherein the input circuit is connected to a first node, and is configured to control a level of the first node in response to an input signal;

the first node reset circuit is connected to the first node, and is configured to reset the first node in response to a reset signal;

the output circuit is connected to the first node and an output terminal, and is configured to output a driving signal to the output terminal under control of the level of the first node;

the touch noise reduction circuit is connected to the first node, and is configured to reset the first node in response to a touch start signal;

the first control circuit is connected to the first node, a second node and a third node, and is configured to control a level of the second node under control of the level of the first node and a level of the third node;

the second control circuit is connected to the first node and the third node, and is configured to control the level of the third node under control of the level of the first node;

the first node noise reduction circuit is connected to the first node and the second node, and is configured to perform noise reduction on the first node under control of the level of the second node; and the output noise reduction circuit is connected to the second node and the output terminal, and is configured to perform noise reduction on the output terminal under control of the level of the second node.

2. The shift register unit according to claim 1, wherein the touch noise reduction circuit comprises a first transistor, a gate electrode of the first transistor is configured to be connected with a touch start terminal, a first electrode of the first transistor is configured to be connected with the first node, and a second electrode of the first transistor is connected with a first voltage terminal.

3. The shift register unit according to claim 2, wherein the touch noise reduction circuit further comprises a second transistor, a gate electrode of the second transistor is configured to be connected with the touch start terminal, a first electrode of the second transistor is configured to be connected with the output terminal, and a second electrode of the second transistor is configured to be connected with the first voltage terminal.

4. The shift register unit according to claim 1,
wherein the input circuit comprises a third transistor, a gate electrode of the third transistor is connected with a first electrode of the third transistor, and a second electrode of the third transistor is connected with the first node;
the first node reset circuit comprises a fourth transistor, a gate electrode of the fourth transistor is configured to be connected with a reset terminal, a first electrode of the fourth transistor is configured to be connected with the first node, and a second electrode of the fourth transistor is configured to be connected with a first voltage terminal; and
the output circuit comprises a fifth transistor and a storage capacitor,
a gate electrode of the fifth transistor is configured to be connected with the first node, a first electrode of the fifth transistor is configured to be connected with a clock signal terminal to receive a clock signal and the clock signal is used as the driving signal, and a second electrode of the fifth transistor is configured to be connected with the output terminal; and
a first electrode of the storage capacitor is connected with the first node, and a second electrode of the storage capacitor is connected with the output terminal.

5. The shift register unit according to claim 1,
wherein the first control circuit comprises a sixth transistor and a seventh transistor,
a gate electrode of the sixth transistor is configured to be connected with the third node, a first electrode of the sixth transistor is configured to be connected with a second voltage terminal, a second electrode of the sixth transistor is configured to be connected with the second node,
a gate electrode of the seventh transistor is configured to be connected with the first node, a first electrode of the seventh transistor is configured to be connected with the second node, and a second electrode of the seventh transistor is configured to be connected with a first voltage terminal;
the second control circuit comprises an eighth transistor and a ninth transistor,
a gate electrode of the eighth transistor is connected with a first electrode of the eighth transistor and the gate electrode of the eighth transistor is configured to be connected with a second voltage terminal, and a second electrode of the eighth transistor is configured to be connected with the third node; and
a gate electrode of the ninth transistor is configured to be connected with the first node, a first electrode of the ninth transistor is configured to be connected with the third node, and a second electrode of the ninth transistor is configured to be connected with the first voltage terminal;
the first node noise reduction circuit comprises a tenth transistor,
a gate electrode of the tenth transistor is configured to be connected with the second node, a first electrode of the tenth transistor is configured to be connected with the first node, and a second electrode of the tenth transistor is configured to be connected with the first voltage terminal; and
the output noise reduction circuit comprises an eleventh transistor, a gate electrode of the eleventh transistor is configured to be connected with the second node, a first electrode of the eleventh transistor is configured to be connected with the output terminal, and a second electrode of the eleventh transistor is configured to be connected with the first voltage terminal.

6. The shift register unit according to claim 5,
wherein the touch noise reduction circuit further comprises a second transistor, a gate electrode of the second transistor is configured to be connected with the touch start terminal, a first electrode of the second transistor is configured to be connected with the output terminal, and a second electrode of the second transistor is configured to be connected with the first voltage terminal;
the input circuit comprises a third transistor, a gate electrode of the third transistor is connected with a first electrode of the third transistor, and a second electrode of the third transistor is connected with the first node;
the first reset circuit comprises a fourth transistor, a gate electrode of the fourth transistor is configured to be connected with a reset terminal, a first electrode of the fourth transistor is configured to be connected with the first node, and a second electrode of the fourth transistor is configured to be connected with a first voltage terminal; and
the output circuit comprises a fifth transistor and a storage capacitor,
a gate electrode of the fifth transistor is configured to be connected with the first node, a first electrode of the fifth transistor is configured to be connected with a clock signal terminal to receive a clock signal and the clock signal is used as the driving signal, and a second electrode of the fifth transistor is configured to be connected with the output terminal; and
a first electrode of the storage capacitor is connected with the first node, and a second electrode of the storage capacitor is connected with the output terminal.

7. A driving method of the shift register unit according to claim 1, comprising:
controlling the level of the first node, by the input circuit, in response to the input signal;
outputting the driving signal to the output terminal, by the output circuit, under control of the level of the first node;
resetting the first node, by the first node reset circuit, in response to the reset signal; and
resetting the first node, by the touch noise reduction circuit, in response to the touch start signal.

8. A gate drive circuit, comprising a plurality of cascaded shift register units,
wherein the plurality of shift register units comprise P first shift register units, each of the P first shift register units adopts the shift register unit according to claim 1, and P is an integer greater than zero.

9. The gate drive circuit according to claim 8, further comprising a touch start signal line and P touch stop signal lines,
wherein a reset terminal of each of the P first shift register units and a touch start terminal of each of the P first shift register units are connected with the touch start signal line to receive the touch start signal; and
input terminals of next stages of shift register units of respective first shift register units are respectively connected with the P touch stop signal lines to receive different touch stop signals.

10. The gate drive circuit according to claim 9,
wherein the P touch stop signal lines comprise a first touch stop signal line,
an (N)th stage of shift register unit is one of the P first shift register units,
a reset terminal of the (N)th stage of shift register unit and a touch start terminal of the (N)th stage of shift register unit are connected with the touch start signal line to receive the touch start signal,
an input terminal of an (N+1)th stage of shift register unit is connected with the first touch stop signal line to receive a first touch stop signal,
and N is an integer greater than one.

11. The gate drive circuit according to claim 10,
wherein the P touch stop signal lines further comprise a second touch stop signal line,
an (M)th stage of shift register unit is one of the P first shift register units,
a reset terminal of the (M)th stage of shift register unit and a touch start terminal of the (M)th stage of shift register unit are connected with the touch start signal line to receive the touch start signal,
and an input terminal of an (M+1)th stage of shift register unit is connected with the second touch stop signal line to receive a second touch stop signal;
except a last stage of shift register unit, the (N)th stage of shift register unit and the (M)th stage of shift register unit, a reset terminal of each of other stages of shift register units is connected with an output terminal of a shift register unit in a next stage;
except a first stage of shift register unit, the (N+1)th stage of shift register unit and the (M+1)th stage of shift register unit, an input terminal of each of other stages of shift register units is connected with an output terminal of a shift register unit in a previous stage; and
M is an integer greater than four, and M>N+2.

12. The gate drive circuit according to claim 8, further comprising a first touch start signal line, a second touch start signal line, Q touch stop signal lines, Q first shift register unit groups and Q second shift register unit groups,
wherein P=20, and Q is an integer greater than zero;
each of the Q first shift register unit groups comprises two adjacent cascaded first shift register units, and each of the Q second shift register unit groups comprises two shift register units, which are cascaded with each of the Q first shift register unit groups, after each of the Q first shift register unit groups;
a reset terminal of an earlier stage of shift register unit in each of the Q first shift register unit groups and a touch start terminal of the earlier stage of shift register unit in each of the Q first shift register unit groups are connected with the first touch start signal line to receive a first touch start signal, and a reset terminal of a later stage of shift register unit in each of the Q first shift register unit groups and a touch start terminal of the later stage of shift register unit in each of the Q first shift register unit groups are connected with the second touch start signal line to receive a second touch start signal; and
input terminals of the two shift register units of each of the Q second shift register unit groups are connected with a same one of the Q touch stop signal lines, and input terminals of shift register units of different second shift register unit groups are connected with different touch stop signal lines.

13. The gate drive circuit according to claim 12,
wherein the Q touch stop signal lines comprise a first touch stop signal line,
an (N−1)th stage of shift register unit and an (N)th stage of shift register unit are two of the P first shift register units,
a reset terminal of the (N−1)th stage of shift register unit and a touch start terminal of the (N−1)th stage of shift register unit are connected with the first touch start signal line to receive a first touch start signal,
a reset terminal of the (N)th stage of shift register unit and a touch start terminal of the (N)th stage of shift register unit are connected with the second touch start signal line to receive a second touch start signal,
an input terminal of an (N+1)th stage of shift register unit and an input terminal of an (N+2)th stage of shift register unit are connected with the first touch stop signal line to receive a first touch stop signal,
and N is an integer greater than two.

14. The gate drive circuit according to claim 13,
wherein the Q touch stop signal lines further comprise a second touch stop signal line,
an (M−1)th stage of shift register unit and an (M)th stage of shift register unit are two of the P first shift register units,
a reset terminal of the (M−1)th stage of shift register unit and a touch start terminal of the (M−1)th stage of shift register unit are connected with the first touch start signal line to receive the first touch start signal,
a reset terminal of the (M)th stage of shift register unit and a touch start terminal of the (M)th stage of shift register unit are connected with the second touch start signal line to receive the second touch start signal, and
an input terminal of an (M+1)th stage of shift register unit and an input terminal of an (M+2)th stage of shift register unit are connected with the second touch stop signal line to receive a second touch stop signal;
except last two stages of shift register units, the (N−1)th stage of shift register unit, the (M−1)th stage of shift register unit, the (N)th stage of shift register unit and the (M)th stage of shift register unit, a reset terminal of each of other stages of shift register units is connected with an output terminal of a next stage of shift register unit separated from the reset terminal by one stage;
and except a first stage of shift register unit, a second stage of shift register unit, the (N+1)th stage of shift register unit, the (M+1)th stage of shift register unit, the (N+2)th stage of shift register unit and the (M+2)th stage of shift register unit, an input terminal of each of other stages of shift register units is connected with an output terminal of a previous stage of shift register unit separated from the input terminal by one stage;
and M is an integer greater than six, and M>N+3.

15. A display device, comprising the gate drive circuit according to claim 8.

16. A driving method of the gate drive circuit according to claim 8, comprising:
inputting a touch start signal to touch noise reduction circuits of the P first shift register units to reset first nodes of the P first shift register units.

17. The driving method according to claim 16, comprising at least one touch scanning phase,
wherein an (X)th stage of shift register unit is one of the P first shift register units, X is an integer greater than one, and the driving method further comprises:
in a first phase, outputting a gate scanning signal by an output terminal of the (X)th stage of shift register unit;

in a second phase, inputting the touch start signal through a touch start signal line to reset a first node of the (X)th stage of shift register unit;

causing the gate drive circuit to enter the touch scanning phase;

in a third phase, inputting a touch stop signal through a touch stop signal line to control a level of a first node of an (X+1)th stage of shift register unit; and in a fourth phase, outputting the gate scanning signal by an output terminal of the (X+1)th stage of shift register unit.

18. The driving method according to claim 16, comprising at least one touch scanning phase, wherein a (Y−1)th stage of shift register unit and a (Y)th stage of shift register unit are two of the P first shift register units, Y is an integer greater than two, and the driving method further comprises:

in a first phase, outputting a gate scanning signal by an output terminal of the (Y−1)th stage of shift register unit;

in a second phase, outputting the gate scanning signal by an output terminal of the (Y)th stage of shift register unit;

in a third phase, inputting a first touch start signal through a first touch start signal line to reset a first node of the (Y−1)th stage of shift register unit;

in a fourth phase, inputting a second touch start signal through a second touch start signal line to reset a first node of the (Y)th stage of shift register unit;

causing the gate drive circuit to enter the touch scanning phase;

in a fifth phase, inputting a touch stop signal through a touch stop signal line to control a level of a first node of a (Y+1)th stage of shift register unit and a level of a first node of a (Y+2)th stage of shift register unit;

in a sixth phase, outputting the gate scanning signal by an output terminal of the (Y+1)th stage of shift register unit; and in a seventh phase, outputting the gate scanning signal by an output terminal of the (Y+2)th stage of shift register unit.

* * * * *